United States Patent
Shim et al.

(10) Patent No.: US 12,527,152 B2
(45) Date of Patent: Jan. 13, 2026

(54) DISPLAY DEVICE INCLUDING PARTITION WALL COVERING ENTIRETY OF CONTACT HOLE

(71) Applicant: Samsung Display Co., LTD., Yongin-si (KR)

(72) Inventors: Yi Seop Shim, Suwon-si (KR); Suk Hoon Kang, Seoul (KR); Jeongsoo Kim, Anyang-si (KR); Beom-Soo Shin, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 428 days.

(21) Appl. No.: 18/082,550

(22) Filed: Dec. 15, 2022

(65) Prior Publication Data
US 2023/0255041 A1      Aug. 10, 2023

(30) Foreign Application Priority Data

Feb. 7, 2022   (KR) .......................... 10-2022-0015694

(51) Int. Cl.
*H10K 59/122* (2023.01)
*G02F 1/1335* (2006.01)
*H10K 50/115* (2023.01)

(52) U.S. Cl.
CPC ..... *H10K 50/115* (2023.02); *G02F 1/133516* (2013.01)

(58) Field of Classification Search
CPC .. H10K 50/115; H10K 71/135; H10K 59/122; H10K 59/123; H10K 59/1213; G02F 1/133516; H01L 25/0753; G09G 3/32; H10D 86/40; H10H 20/83
See application file for complete search history.

(56) References Cited

U.S. PATENT DOCUMENTS

| | | |
|---|---|---|
| 2010/0219412 A1 | 9/2010 | Lee |
| 2020/0279900 A1 | 9/2020 | Park et al. |
| 2020/0328263 A1 | 10/2020 | Choi et al. |
| 2021/0313400 A1 | 10/2021 | Bae et al. |
| 2023/0037592 A1* | 2/2023 | Huang ................ H10K 50/865 |

(Continued)

FOREIGN PATENT DOCUMENTS

| | | |
|---|---|---|
| KR | 1020060125303 A | 12/2006 |
| KR | 1020190080312 | 7/2019 |
| KR | 1020200042075 | 4/2020 |

(Continued)

OTHER PUBLICATIONS

English Machine Translation of Wei et al , WO 2022 (Year: 2025).*

(Continued)

*Primary Examiner* — Donald L Raleigh
(74) *Attorney, Agent, or Firm* — CANTOR COLBURN LLP

(57) ABSTRACT

A display device includes a substrate, a plurality of transistors disposed on the substrate, a light-emitting device connected to the transistors, a first partition wall disposed above the light-emitting device to partition an emission area, and a second partition wall overlapping the first partition wall. The transistor and the light-emitting device are connected to each other through a contact hole, and an entirety of an area of the contact hole overlaps the first partition wall.

18 Claims, 26 Drawing Sheets

(56) References Cited

U.S. PATENT DOCUMENTS

2024/0196655 A1* 6/2024 Wei ..................... H10K 59/873

FOREIGN PATENT DOCUMENTS

| KR | 1020200088954 | | 7/2020 | | |
|----|---------------|---|--------|---|---|
| KR | 1020200105565 | A | 9/2020 | | |
| KR | 1020200119946 | A | 10/2020 | | |
| KR | 1020200130606 | | 11/2020 | | |
| KR | 1020210124583 | A | 10/2021 | | |
| WO | WO-2022252005 | A1 * | 12/2022 | ......... | H10K 59/8723 |

OTHER PUBLICATIONS

Bo Chang, et al., "Low-height sharp edged patterns for capillary self-alignment assisted hybrid microassembly", J Micro-Bio Robot, (Mar. 12, 2014), pp. 1-10.

* cited by examiner

DISPLAY DEVICE INCLUDING PARTITION WALL COVERING ENTIRETY OF CONTACT HOLE

This application claims priority to Korean Patent Application No. 10-2022-0015694, filed on Feb. 7, 2022, and all the benefits accruing therefrom under 35 U.S.C. § 119, the content of which in its entirety is herein incorporated by reference.

BACKGROUND OF THE INVENTION

(a) Field

The disclosure relates to a display device.

(b) Description of the Related Art

A display device such as an emissive display device creates an image by generating light when holes and electrons injected from an anode and a cathode recombine in an emission layer and thereby emit light, and for example, includes pixels emitting light of any one of red, green, and blue, to express a desired color by a combination of these colors.

To this end, each of the pixels includes a light-emitting device that generates monochromatic light such as white or blue, and a quantum dot layer and a color filter as light control means for converting and outputting the monochromatic light into a desired color among red, green, and blue, etc. That is, when a light-emitting device of each pixel generates monochromatic light, the monochromatic light may be converted into one of red, green, and blue colors while passing through the quantum dot layer and the color filter to be outputted, and an image of a desired color may be realized by a color combination of the pixels emitted with an appropriate color in this way.

The quantum dot layer may be formed by an inkjet method.

SUMMARY

Embodiments have been made in an effort to provide a display device in which an inkjet material is uniformly applied by covering a contact hole with a partition wall.

An embodiment of the invention provides a display device including a substrate, a plurality of transistors disposed on the substrate, a light-emitting device connected to the plurality of transistors, a first partition wall disposed above the light-emitting device to partition an emission area, and a second partition wall overlapping the first partition wall. A transistor of the plurality of transistors and the light-emitting device are connected to each other through a contact hole, and an entirety of an area of the contact hole overlaps the first partition wall.

In an embodiment, the first partition wall may include a vertical portion and a horizontal portion crossing each other, and a width of the horizontal portion overlapping the contact hole may be greater than a width of the horizontal portion not overlapping the contact hole.

In an embodiment, the first partition wall may include a vertical portion, a horizontal portion, and a protrusion protruding from the horizontal portion, crossing each other, and the contact hole may overlap the protrusion.

In an embodiment, a first opening, a second opening, and a third opening overlapping each emission area may be defined in the second partition wall.

In an embodiment, a size of the first opening may be greater than that of the second opening, and the size of the second opening may be greater than that of the third opening.

In an embodiment, the display device may further include a quantum dot layer disposed within each of the first opening, the second opening, and the third opening.

In an embodiment, the third partition wall may not overlap the contact hole.

In an embodiment, the second partition wall may overlap the contact hole.

In an embodiment, the plurality of transistors may include a first transistor, a second transistor, and a third transistor, and the first transistor may receive a driving voltage, the second transistor may receive a data voltage, and the third transistor may receive an initialization voltage.

In an embodiment, a gate electrode of the first transistor may be connected to one electrode of the third transistor.

Another embodiment of the invention provides a display device including a substrate, a plurality of transistors disposed on the substrate, a light-emitting device connected to the plurality of transistors, a first partition wall disposed above the light-emitting device to partition each emission area, and a second partition wall disposed on the first partition wall. A transistor of the plurality of transistors and the light-emitting device are connected to each other through a contact hole, and an entirety of an area of the contact hole overlaps the second partition wall.

In an embodiment, a first opening, a second opening, and a third opening overlapping each emission area may be defined in the second partition wall.

In an embodiment, an upper horizontal portion of the first opening may be disposed below an upper horizontal portion of the second opening in a second direction.

In an embodiment, the third opening may not overlap the contact hole.

In an embodiment, the second partition wall may include a protrusion protruding to the first opening, and the protrusion may overlap the contact hole.

In an embodiment, it may further include a quantum dot layer disposed within each of the first opening, the second opening, and the third opening.

In an embodiment, the first partition wall may include a vertical portion and a horizontal portion crossing each other.

In an embodiment, the contact hole may overlap the first partition wall, and a width of the horizontal portion overlapping the contact hole may be greater than a width of the horizontal portion not overlapping the contact hole.

In an embodiment, the first partition wall may include a vertical portion, a horizontal portion, and a protrusion protruding from the horizontal portion, and crossing each other, and the contact hole may overlap the protrusion.

In an embodiment, the plurality of transistors may include a first transistor, a second transistor, and a third transistor, the first transistor may receive a driving voltage, the second transistor may receive a data voltage, and the third transistor may receive an initialization voltage.

By the embodiments, a display device capable of uniformly applying an inkjet material by covering a contact hole with a partition wall is provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
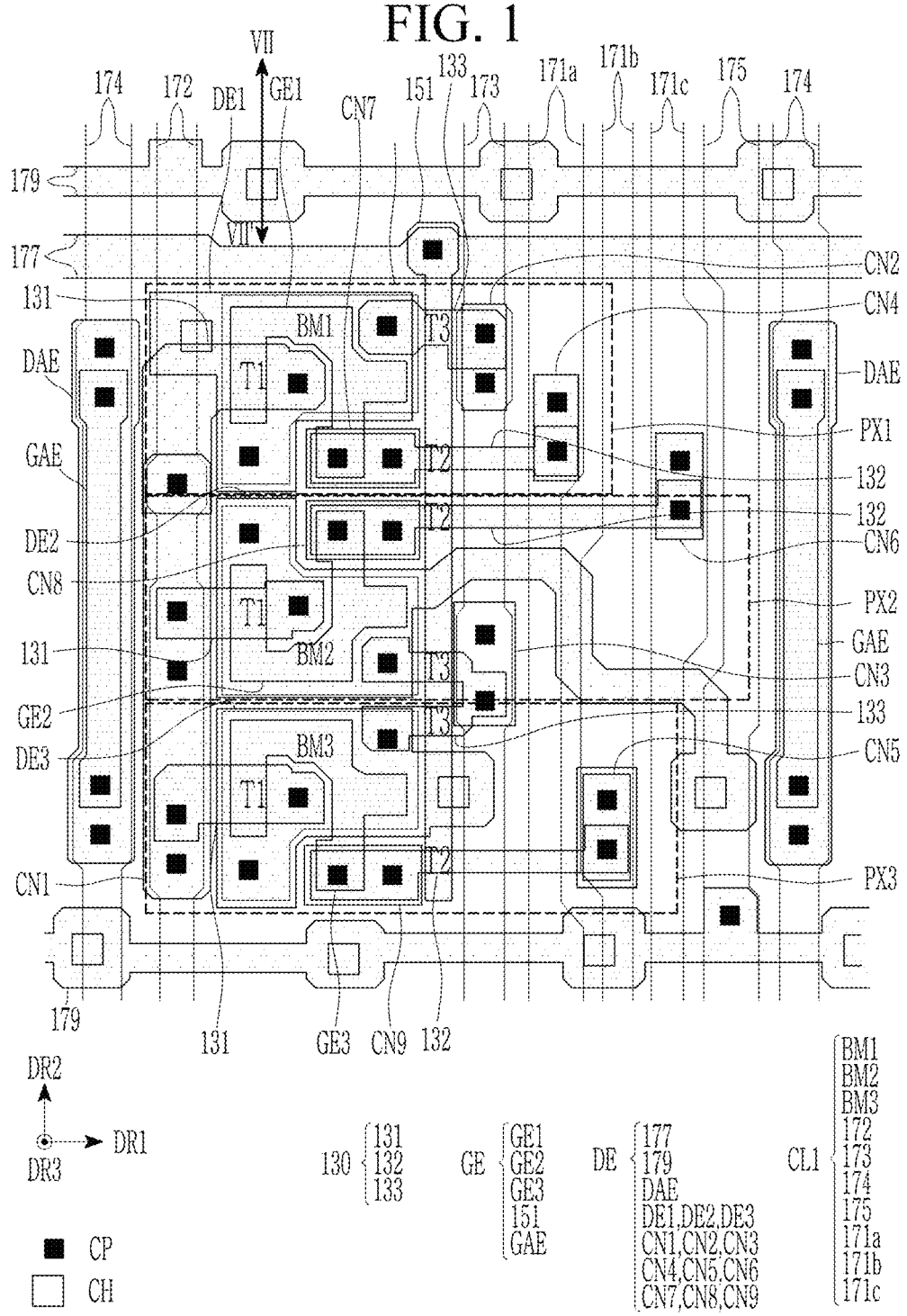
FIG. 1 illustrates a plan view of an embodiment of a display device.

Embodiments of the invention will be described more fully hereinafter with reference to the accompanying drawings, in which illustrative embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed or positioned on or below the object portion, and does not necessarily mean disposed or positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, a display device in an embodiment of the invention will be described in detail with reference to drawings.

FIG. 1 illustrates a plan view of an embodiment of a display device. FIG. 2 to FIG. 6 illustrate an embodiment of a stacked structure for each layer of the display device of FIG. 1. FIG. 7 illustrates a cross-sectional view taken along line VII-VII' of FIG. 1.

Referring to FIG. 1, transistors of three pixels PX1, PX2, and PX3 are simultaneously illustrated in FIG. 1. In the specification, each of the pixels PX1, PX2, and PX3 may include three transistors T1, T2, and T3 and a light-emitting device connected thereto. Hereinafter, for convenience of description, the first pixel PX1 will be used as a reference.

Figure 2:
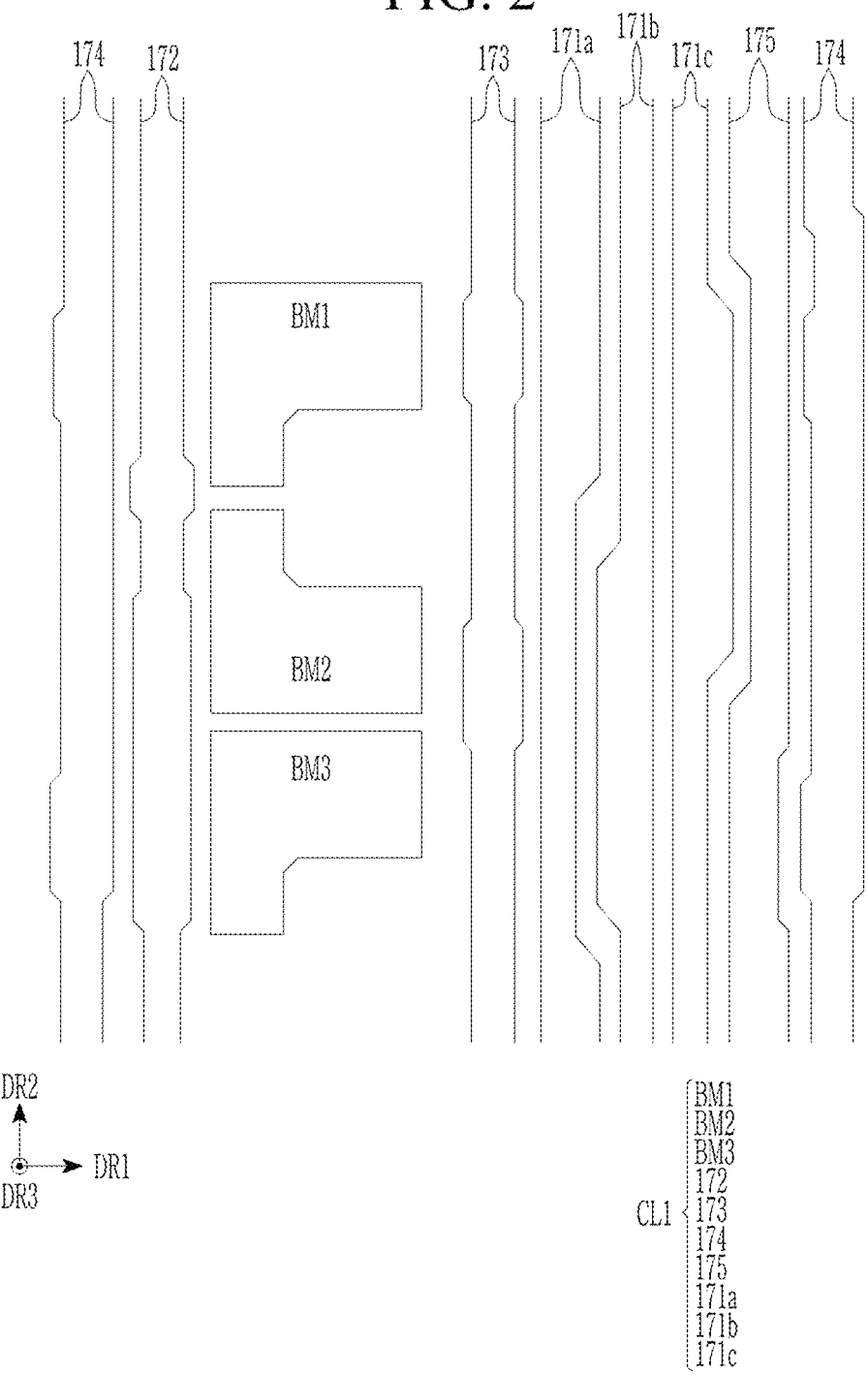
FIG. 2 to FIG. 6 illustrate an embodiment of a stacked structure for each layer of the display device of FIG. 1.

Referring to FIG. 1, FIG. 2, and FIG. 7 together, a first conductive layer CL1 disposed on a substrate SUB is included. The first conductive layer CL1 includes a first data line 171a, a second data line 171b, a third data line 171c, a driving voltage line 172, an initialization voltage line 173, a driving low voltage line 174, and an auxiliary line 175 disposed in parallel to a second direction DR2, and a first light-blocking member BM1, a second light-blocking member BM2, and a third light-blocking member BM3 disposed in a plate shape.

Figure 3:
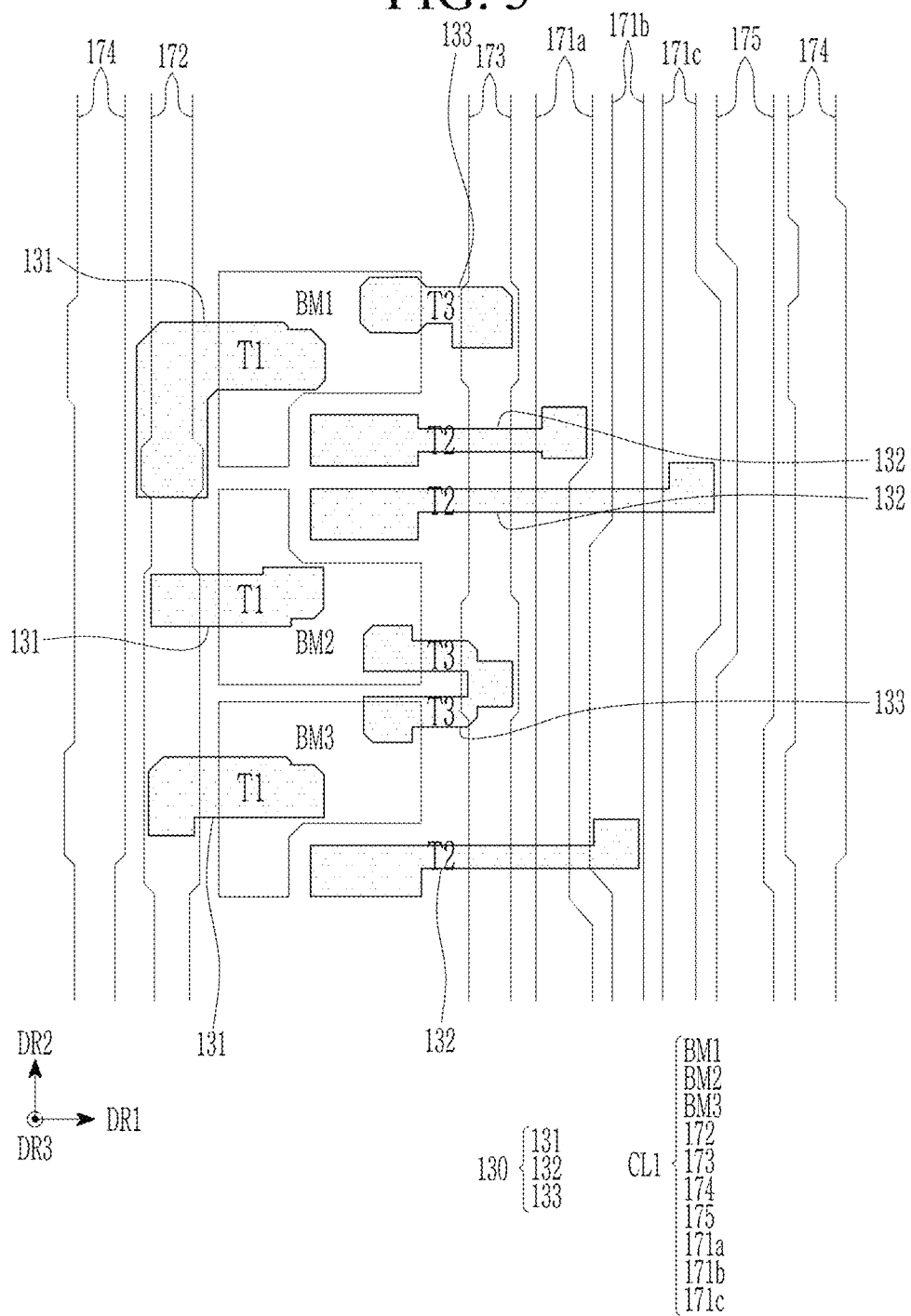

Next, referring to FIG. 1 and FIG. 3 together, a semiconductor layer 130 disposed on the first conductive layer CL1 is included. Referring to FIG. 7 together, a first insulating layer IL1 may be disposed between the first conductive layer CL1 and the semiconductor layer 130 to insulate the first conductive layer CL1 from the semiconductor layer 130.

The semiconductor layer 130 may include a first portion 131, a second portion 132, and a third portion 133 for each pixel. The first portion 131 may constitute a first transistor T1, the second portion 132 may constitute a second transistor T2, and the third portion 133 may constitute a third transistor T3.

In a first pixel PX1, a portion of the first portion 131 may overlap the driving voltage line 172, and may overlap the first light-blocking member BM1. A portion of the second portion 132 may overlap the first data line 171a. A portion of the third portion 133 may overlap the initialization voltage line 173. In the above description, the first pixel PX1 is used as a reference, but descriptions of the first portion 131, the second portion 132, and the third portion 133 of the semiconductor layer 130 disposed in the second pixel PX2 and the third pixel PX3 are also the same.

Figure 4:
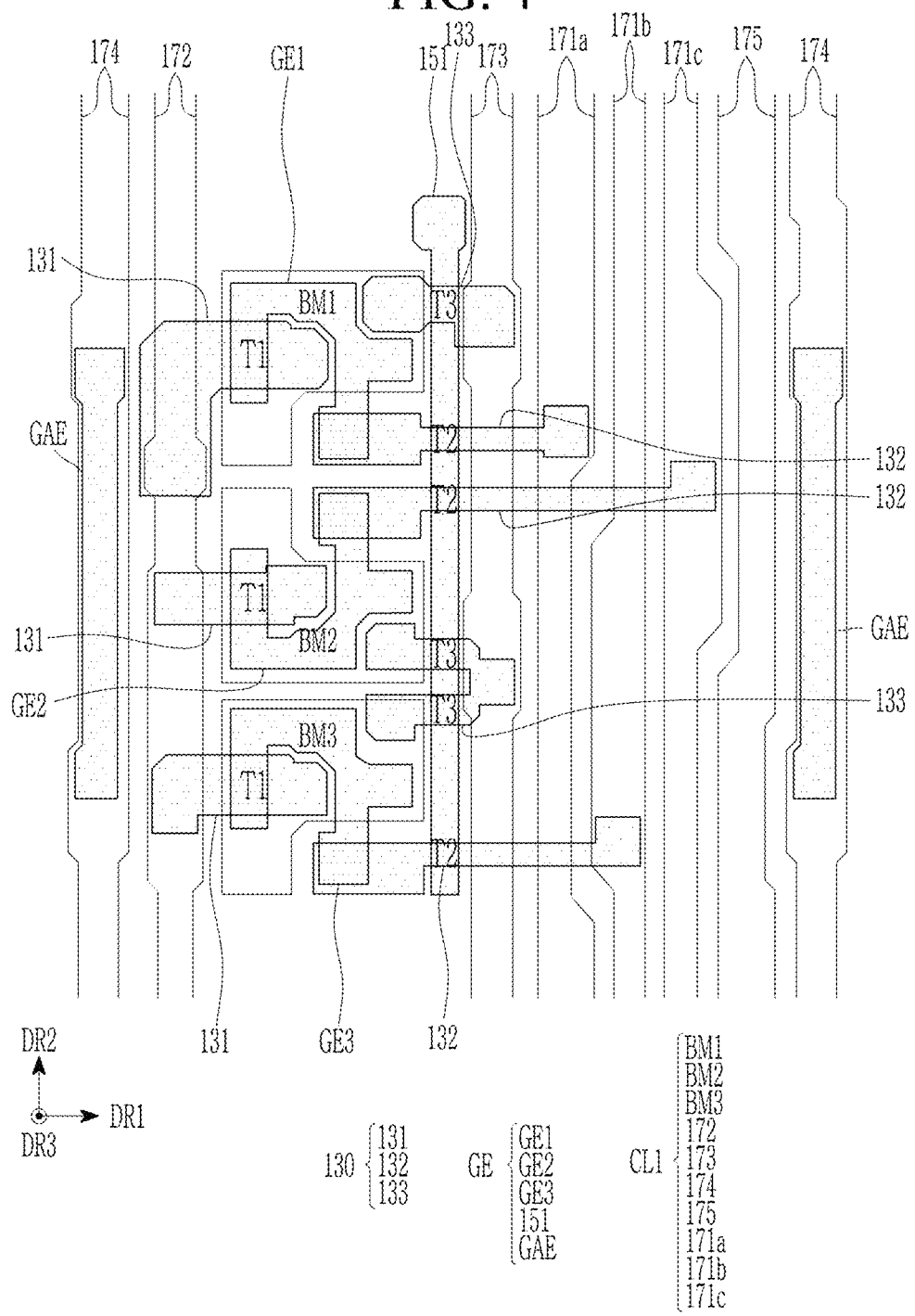

Next, referring to FIG. 1 and FIG. 4 together, a gate conductive layer GE is disposed on the semiconductor layer 130. Referring to FIG. 7 together, a second insulating layer IL2 may be disposed between the semiconductor layer 130 and the gate conductive layer GE to insulate the semiconductor layer 130 from the gate conductive layer GE.

The gate conductive layer GE may include a first gate electrode GE1, a second gate electrode GE2, and a third gate electrode GE3 overlapping the first light-blocking member BM1, the second light-blocking member BM2, and the third light-blocking member BM3, a gate auxiliary layer GAE overlapping the driving low voltage line 174, and a scan connection line 151 disposed along the second direction DR2.

The first gate electrode GE1 may partially overlap the first portion 131 of the semiconductor layer 130 to constitute a gate electrode of the first transistor T1. Although the first gate electrode GE1 will be described later, it may be connected to one electrode of the third transistor T3.

In the above description, the first pixel PX1 is used as the reference, but descriptions of the second gate electrode GE2 disposed at the second pixel PX2 and the third gate electrode GE3 disposed at the third pixel PX3 are also the same. That is, the second gate electrode GE2 may partially overlap the first portion 131 of the semiconductor layer 130 disposed in the second pixel PX2 to serve as a gate electrode of the first transistor T1. Similarly, the third gate electrode GE3 may partially overlap the first portion 131 of the semiconductor layer 130 disposed in the third pixel PX3 to serve as a gate electrode of the first transistor T1.

The gate auxiliary layer GAE overlapping the driving low voltage line 174 is then electrically connected to the driving low voltage line 174 to reduce resistance of the driving low voltage line 174.

The scan connection line 151 partially overlaps the second portion 132 and the third portion 133 of the semiconductor layer 130. That is, the scan connection line 151 may constitute gate electrodes of the second transistor T2 and the third transistor T3. As will be described later, the scan connection line 151 may be connected to a scan line to transmit a scan signal to the second transistor T2 and the third transistor T3.

Figure 5:
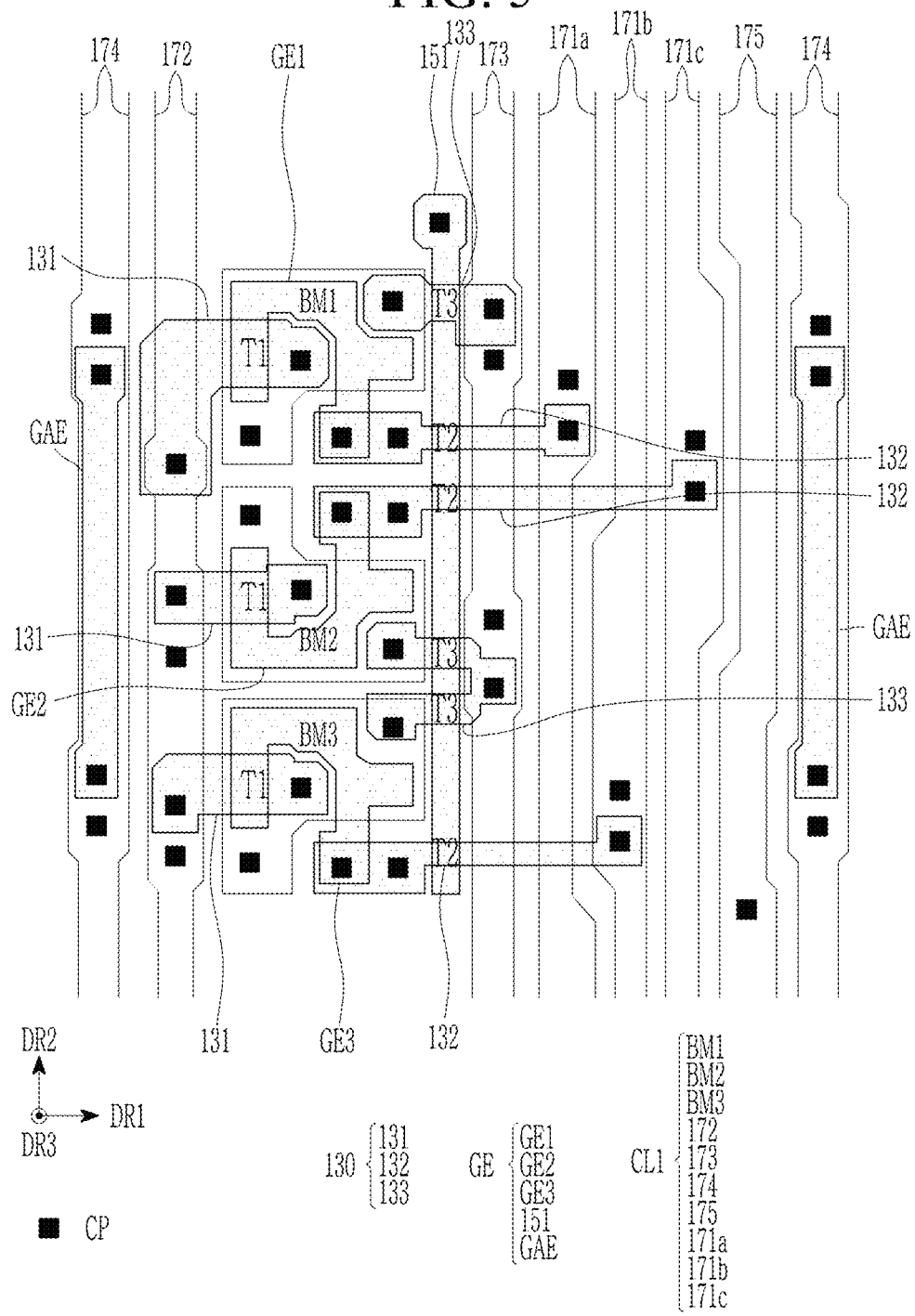

Referring to FIG. 7 together, a third insulating layer IL3 is disposed on the gate conductive layer GE. FIG. 5 illustrates the connection hole CP defined in the aforementioned insulating layer, i.e., the first insulating layer IL1, the second insulating layer IL2, or the third insulating layer IL3. Referring to FIG. 4, each connection hole CP may expose the first conductive layer CL1, the semiconductor layer 130, and the gate conductive layer GE.

Figure 6:
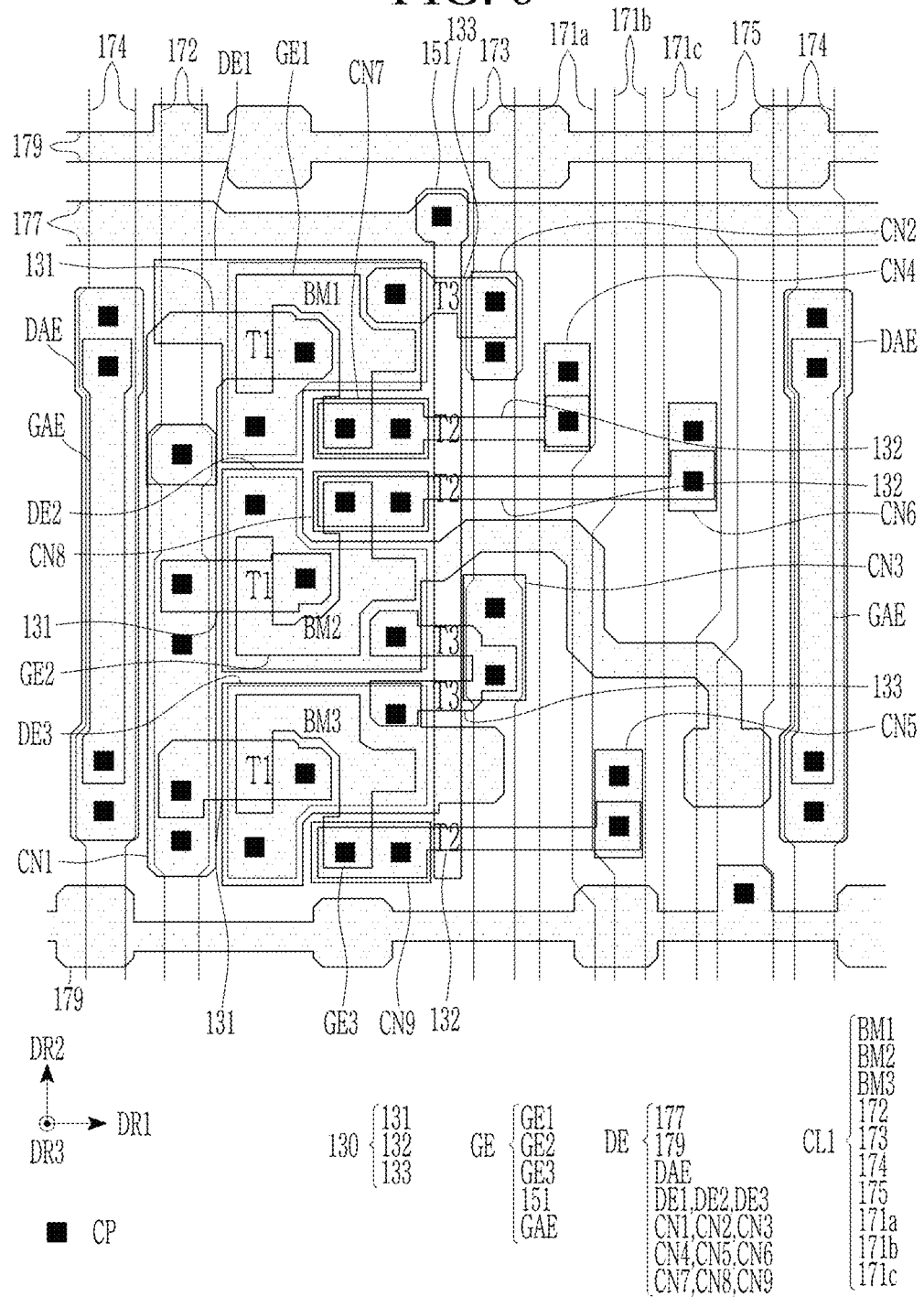
Figure 7:
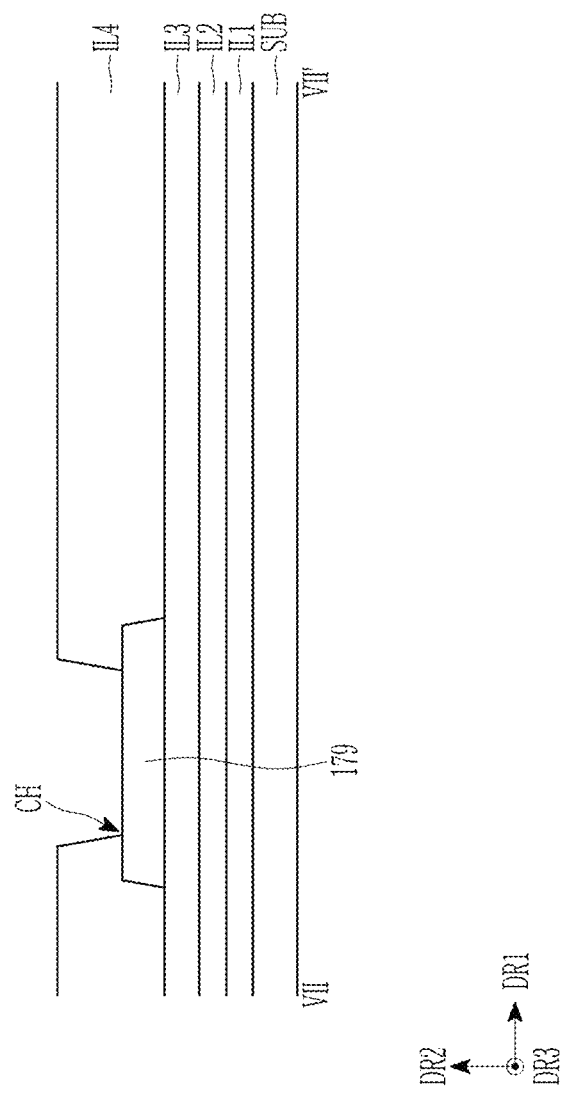
FIG. 7 illustrates a cross-sectional view taken along line VII-VII' of FIG. 1.

Next, referring to FIG. 1 and FIG. 6 together, a data conductive layer DE is disposed on the gate conductive layer GE and the third insulating layer IL3. The data conductive layer DE includes a scan line 177 and a device connection line 179 disposed along a first direction DR1. In addition, the data conductive layer DE may include a data auxiliary layer DAE overlapping the driving low voltage line 174 along the second direction DR2, a first connection member CN1 overlapping the driving voltage line 172, a second connection member CN2 and a third connection member CN3 overlapping the initialization voltage line 173, a fourth connection member CN4, a fifth connection member CN5, and a sixth connection member CN6 respectively overlapping the first data line 171a, the second data line 171b, and the third data line 171c, and the seventh connection member CN7, the eighth connection member CN8, and the ninth connection member CN9 overlapping the second portion 132 of the semiconductor layer 130 of each pixel.

In addition, the data conductive layer DE includes a first data electrode DE1, a second data electrode DE2, and a third data electrode DE3 overlapping the first gate electrode GE1, the second gate electrode GE2, and the third gate electrode GE3.

Referring to FIG. 5, each data conductive layer DE is connected to the first conductive layer CL1, the semiconductor layer 130, and the gate conductive layer GE through the connection hole CP.

In FIG. 5, the driving voltage line 172 is connected to the first connection member CN1 through the connection hole CP. The first connection member CN1 is connected to the first portion 131 of the semiconductor layer 130, i.e., the first transistor T1, through another connection hole CP. Accordingly, a driving voltage of the driving voltage line 172 is transferred to the first transistor T1 through the first connection member CN1.

The first data line 171a is connected to the fourth connection member CN4 through the connection hole CP, and the fourth connection member CN4 is connected to the second portion 132 of the semiconductor layer 130, i.e., the second transistor T2, through another connection hole CP. Accordingly, a data voltage of the first data line 171a is transferred to the second transistor T2. The scan connection line 151 is connected to the scan line 177 through the connection hole CP, and thus a scan signal of the scan line 177 is transferred to the scan connection line 151. The scan connection line 151 is a gate electrode of the second transistor T2, and thus the second transistor T2 may receive a data voltage depending on a scan signal.

The second data line 171b is connected to the fifth connection member CN5 through the connection hole CP, and the fifth connection member CN5 is connected to the second portion 132 of the semiconductor layer 130, i.e., the second transistor T2, through another connection hole CP.

The third data line 171c is connected to the sixth connection member CN6 through the connection hole CP, and the sixth connection member CN6 is connected to the second portion 132 of the semiconductor layer 130, i.e., the second transistor T2, through another connection hole CP.

That is, the first data line 171a, the second data line 171b, and the third data line 171c are connected to the second transistor T2 disposed in the first pixel PX1, the second pixel PX2, and the third pixel PX3 through the fourth connection member CN4, the fifth connection member CN5, and the sixth connection member CN6, respectively.

Similarly, the initialization voltage line 173 is connected to the second connection member CN2 and the third connection member CN3 through the connection hole CP. The second connection member CN2 and the third connection member CN3 are connected to the third portion 133 of the semiconductor layer 130, i.e., the third transistor T3, through respective connection holes CP. Accordingly, an initialization voltage of the initialization voltage line 173 is transferred to the third transistor T3 of each pixel through the second connection member CN2 and the third connection member CN3.

The seventh connection member CN7 is connected to the third portion 133 of the semiconductor layer 130 of the first pixel PX1 through the connection hole CP, and is connected to the first gate electrode GE1 through another connection hole CP. That is, the seventh connection member CN7 connects the third transistor T3 and the first gate electrode GE1. One electrode of the third transistor T3 of the first pixel PX1 is connected to the gate electrode of the first transistor T1 through the seventh connection member CN7.

Similarly, the eighth member CN8 is connected to the third portion 133 of the semiconductor layer 130 of the second pixel PX2 through the connection hole CP, and is connected to the first gate electrode GE1 through another connection hole CP. That is, the eighth connection member CN8 connects the third transistor T3 and the first gate electrode GE1. One electrode of the third transistor T3 of the second pixel PX2 is connected to the gate electrode of the first transistor T1 through the eighth connection member CN8.

Similarly, the ninth connection member CN9 is connected to the third portion 133 of the semiconductor layer 130 of the third pixel PX3 through the connection hole CP, and is connected to the first gate electrode GE1 through another connection hole CP. That is, the ninth connection member CN9 connects the third transistor T3 and the first gate electrode GE1. One electrode of the third transistor T3 of the third pixel PX3 is connected to the gate electrode of the first transistor T1 through the ninth connection member CN9.

Referring to FIG. 7 together, the fourth insulating layer IL4 is disposed on the data conductive layer DE. Referring to FIG. 1 and FIG. 7 together, a plurality of contact holes CH is defined in the fourth insulating layer IL4. The contact holes CH may overlap the first data electrode DE1, the second data electrode DE2, and the third data electrode DE3, respectively. In addition, they may be respectively disposed on the device connection line 179. The device connection line 179 may be connected to the auxiliary line 175 through the contact hole CH. Although not illustrated, each contact hole CH may be connected to a first electrode of the light-emitting device.

The contact hole CH may have a concave step structure compared to other portions. As illustrated in FIG. 7, a region in which the contact hole CH is defined has a step structure having a thickness that is lower than that of other portions due to formation of the contact hole.

Since the contact hole CH has a step, there may be a problem in that the contact hole CH is not well filled in a subsequent inkjet coating process, etc.

The contact holes CH are exposed without being covered by first and second partition walls to be formed later, and there is a problem in that an inkjet material is not sufficiently filled in the contact holes CH. In this case, the inkjet material may be a quantum dot layer that converts blue or white light emitted from a light-emitting device to another color, but the invention is not limited thereto.

Different quantum dot layers may be disposed in each of the pixels PX1, PX2, and PX3 in FIG. 1. That is, monochromatic light emitted from the light-emitting device may be converted into one of red, green, and blue colors to be outputted while passing through quantum dots, and an image of a desired color may be realized by a color combination of pixels emitted with an appropriate color in this way.

Figure 8:
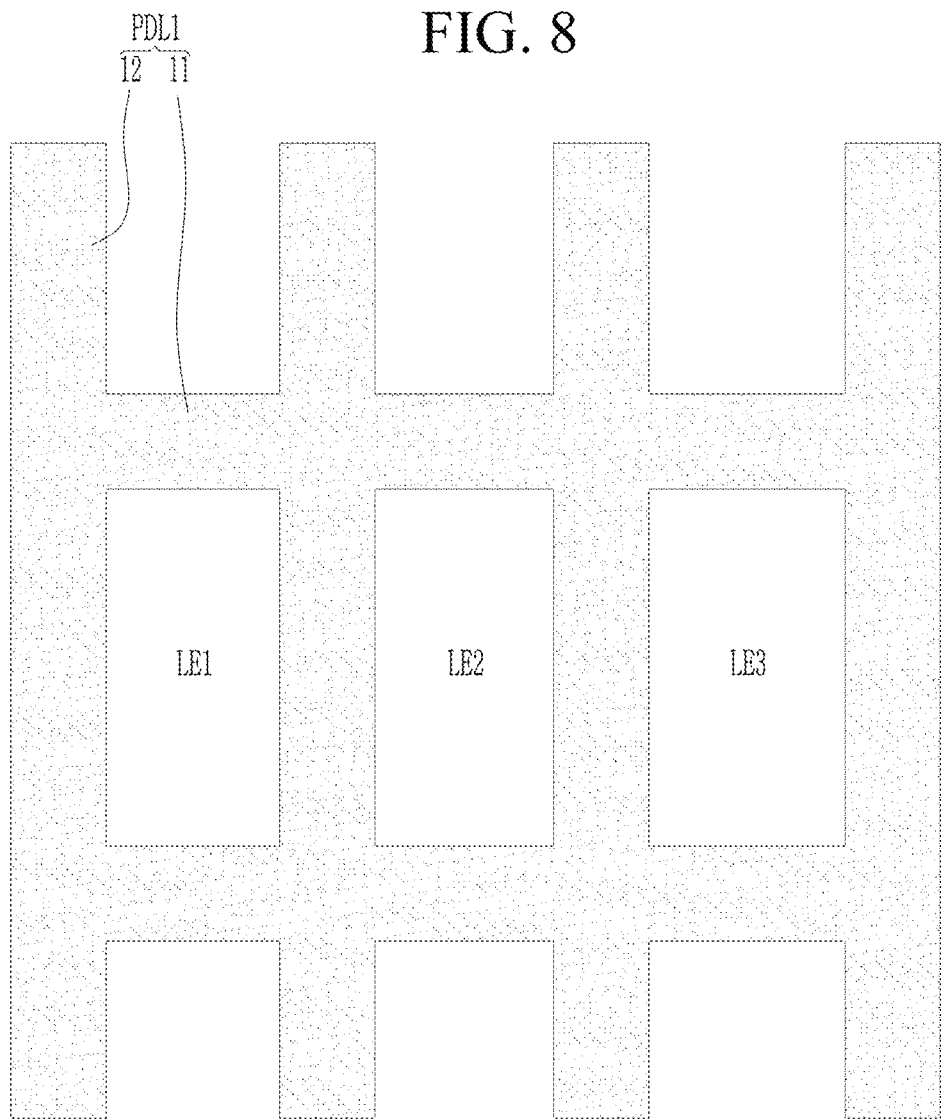
FIG. 8 illustrates a shape of a first partition wall according to a conventional embodiment.
Figure 9:
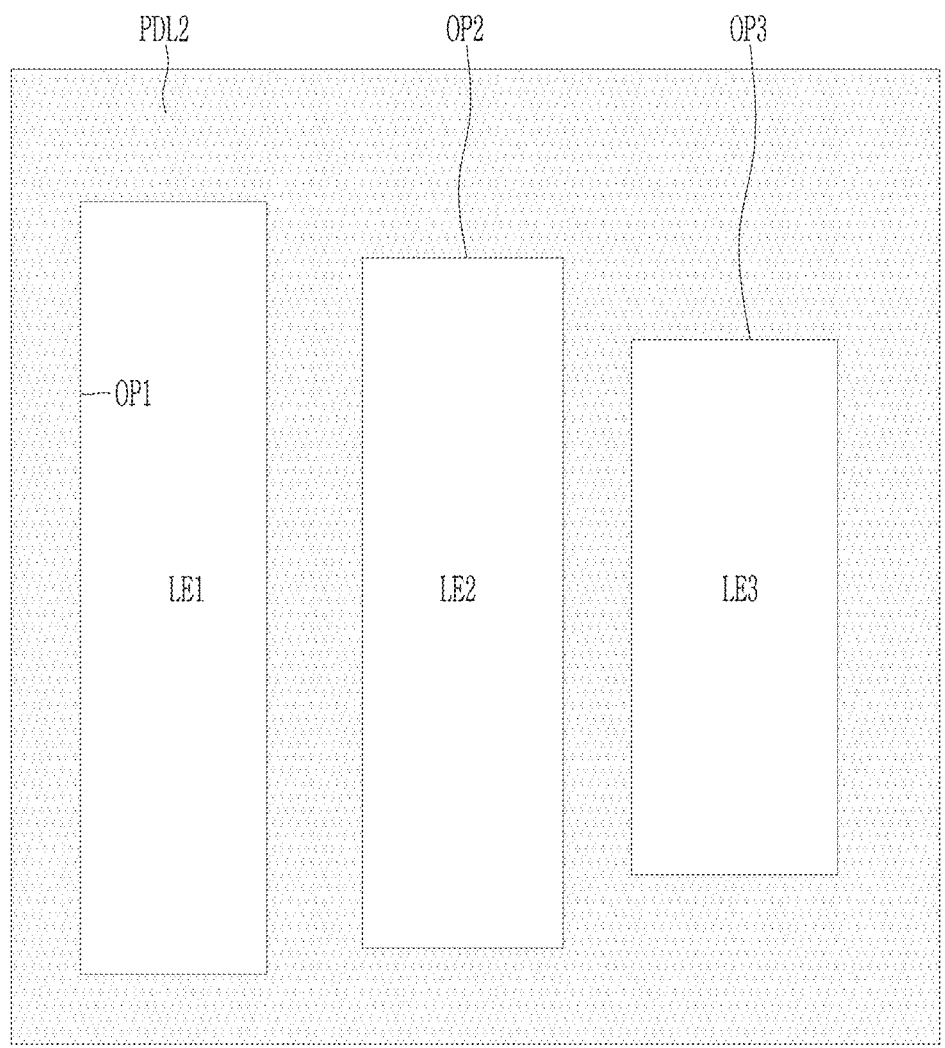
FIG. 9 illustrates a shape of a second partition wall according to a conventional embodiment.

FIG. 8 illustrates a shape of a first partition wall PDL1 according to a conventional embodiment. FIG. 9 illustrates a shape of a second partition wall PDL2 according to the conventional embodiment.

The first partition wall PDL1 may be a partition wall for partitioning emission areas LE1, LE2, and LE3 of each of the pixels PX1, PX2, and PX3. Referring to FIG. 8, the first partition wall PDL1 may include a horizontal portion 11 extending in the first direction DR1 and a vertical portion 12 extending in the second direction DR2 to intersect the horizontal portion 11. A region partitioned by each horizontal portion 11 and each vertical portion 12 may correspond to each pixel.

Referring to FIG. 9, the second partition wall PDL2 may be a partition wall for partitioning the emission areas LE1, LE2, and LE3 of each of the pixels PX1, PX2, and PX3 such that different inkjet materials may be applied. That is, a first opening OP1, a second opening OP2, and a third opening OP3 may be defined in the second partition wall PDL2. The first opening OP1, the second opening OP2, and the third opening OP3 may respectively correspond to the first pixel PX1, the second pixel PX2, and the third pixel PX3. Different inkjet materials may be applied to the openings OP1, OP2, and OP3 as quantum dot layers, so that each pixel may emit different light such as red, green, and blue.

Figure 10:
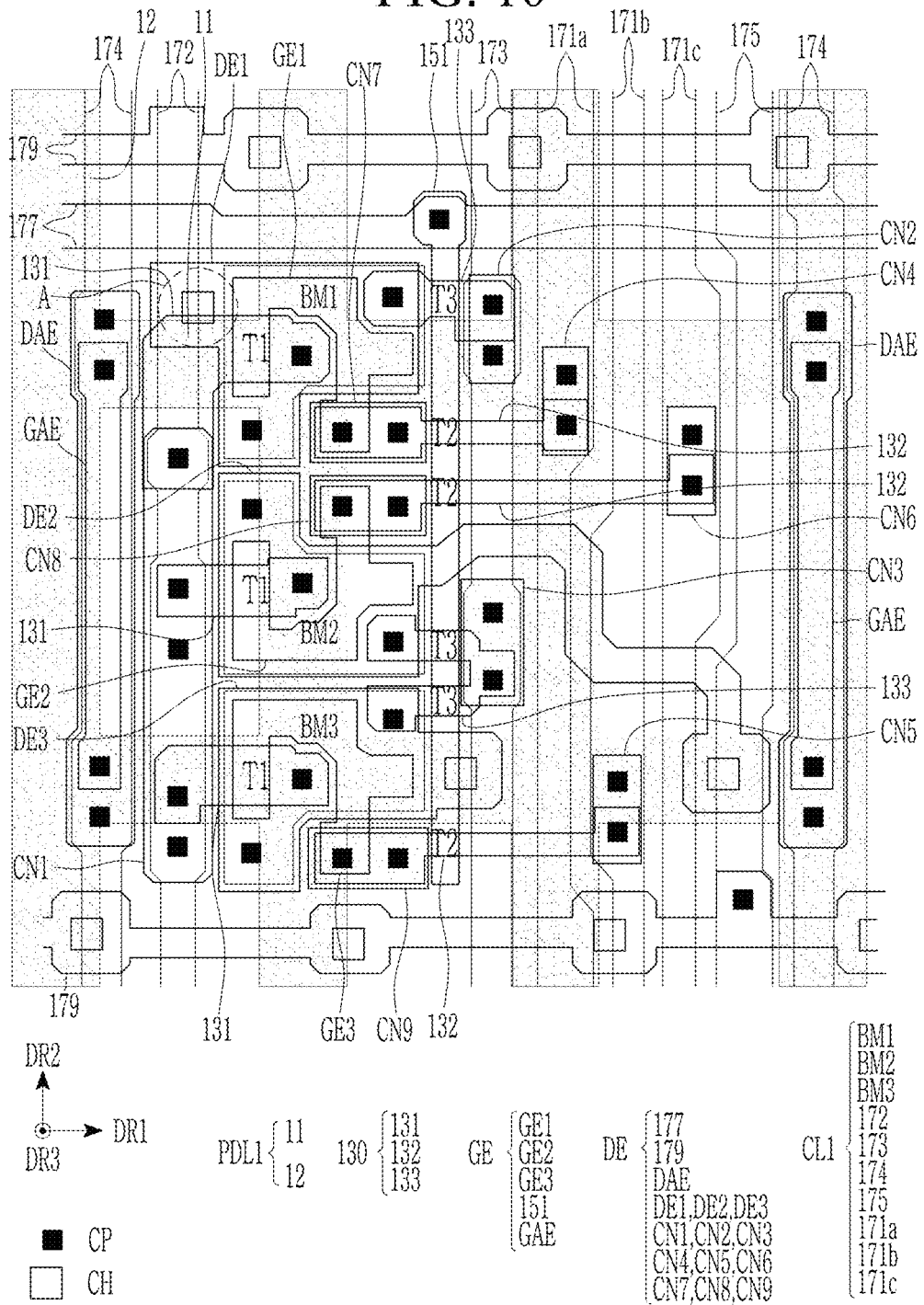
FIG. 10 illustrates a state in which a first partition wall is formed in a display panel having a pixel structure of FIG. 1.

FIG. 10 illustrates a state in which the first partition wall PDL1 is formed in a display panel having a pixel structure of FIG. 1. Referring to FIG. 10, some of the contact holes CH are covered by the first partition wall PDL1, but some of the contact holes CH are exposed without being covered by the first partition wall PDL1. The exposed contact holes CH are marked with a reference character A.

Figure 11:
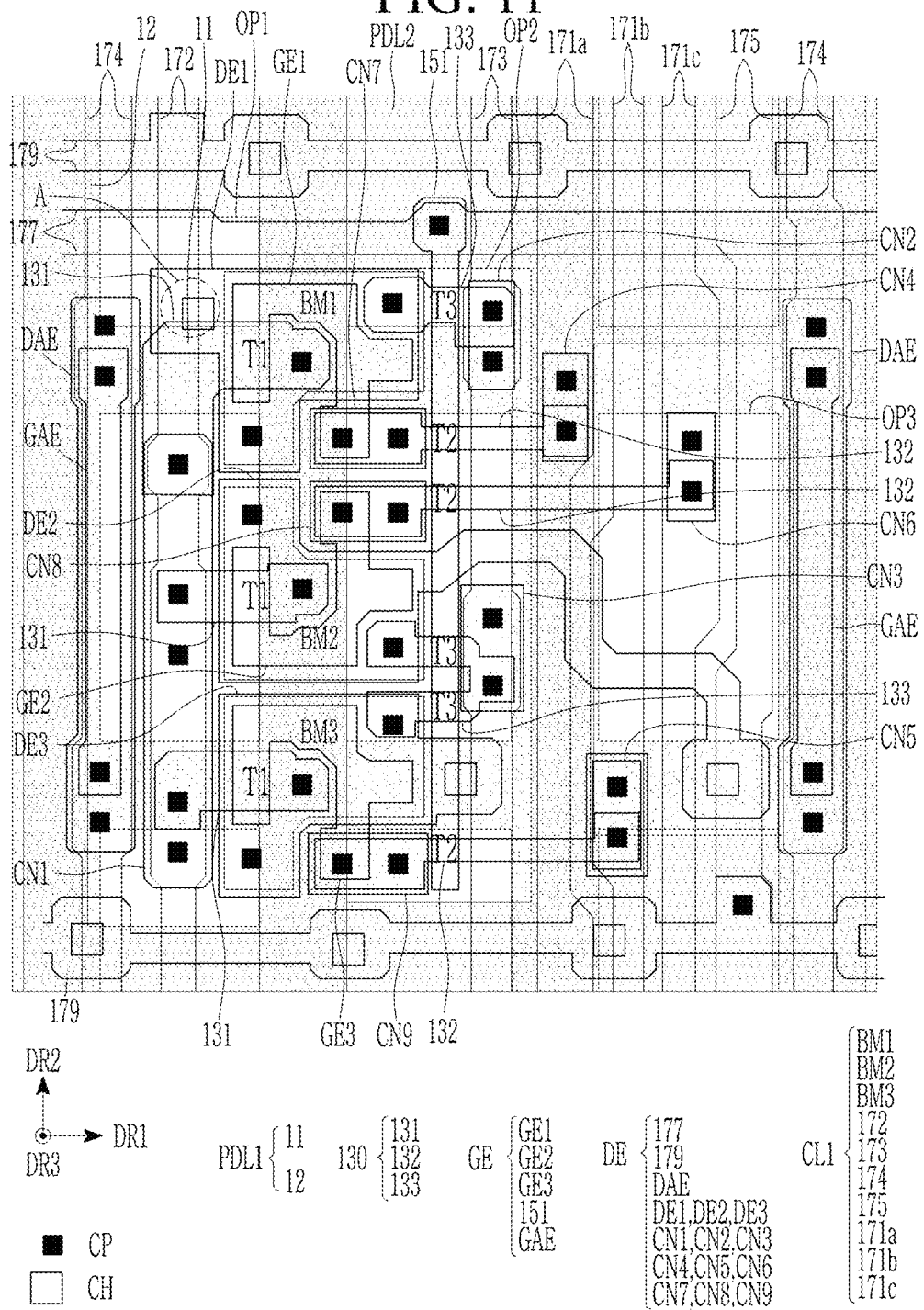
FIG. 11 illustrates an image in which a second partition wall is additionally formed in the embodiment of FIG. 10.

Next, FIG. 11 illustrates an image in which the second partition wall PDL2 is additionally formed in the embodiment of FIG. 10. Even in this case, it was confirmed that part of the contact holes CH was not covered by the second partition wall PDL2 to be exposed.

That is, when a partition wall having a same shape as that of the first and second partition walls PDL1 and PDL2 is formed on the display panel of FIG. 1, part of the contact holes CH are exposed without being covered by the partition wall.

Figure 12:
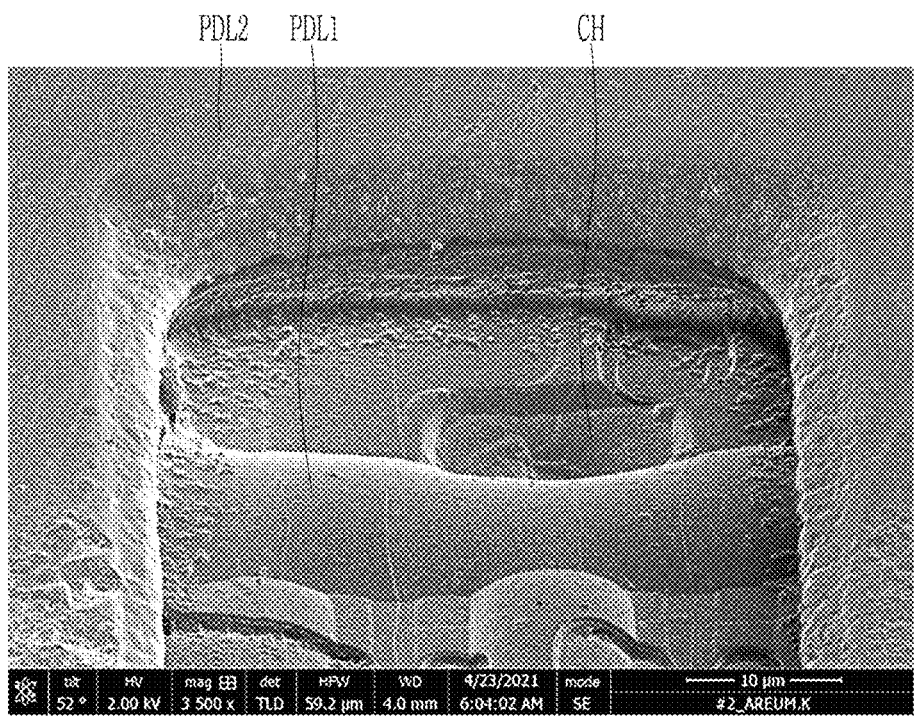
FIG. 12 illustrates an image of a contact hole that is not covered by a partition wall to be exposed.

FIG. 12 illustrates an image of the contact hole CH that is not covered by a partition wall to be exposed. Referring to FIG. 12, the contact hole CH is exposed without being covered by the first partition wall PDL1 and the second partition wall PDL2.

As illustrated in FIG. 7 and FIG. 12, a region in which the contact hole CH is defined has a stepped structure that is recessed compared to other portions due to formation of the contact hole. Since the contact hole CH has a step, the contact hole CH may not be well filled in a subsequent inkjet coating process, etc.

Figure 13:
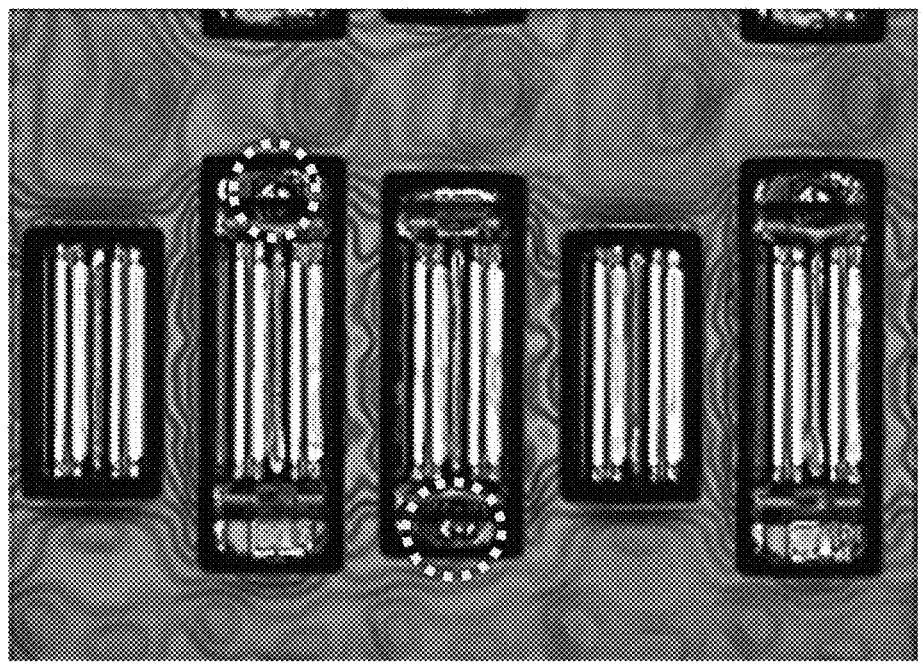
FIG. 13 illustrates an image in which a contact hole is not filled with an inkjet material.

FIG. 13 illustrates an image (a dotted circle portion) of the contact hole CH in which an inkjet material is not filled. The material applied with inkjet may be a quantum dot layer including quantum dots, but the invention is not limited thereto.

Figure 14:
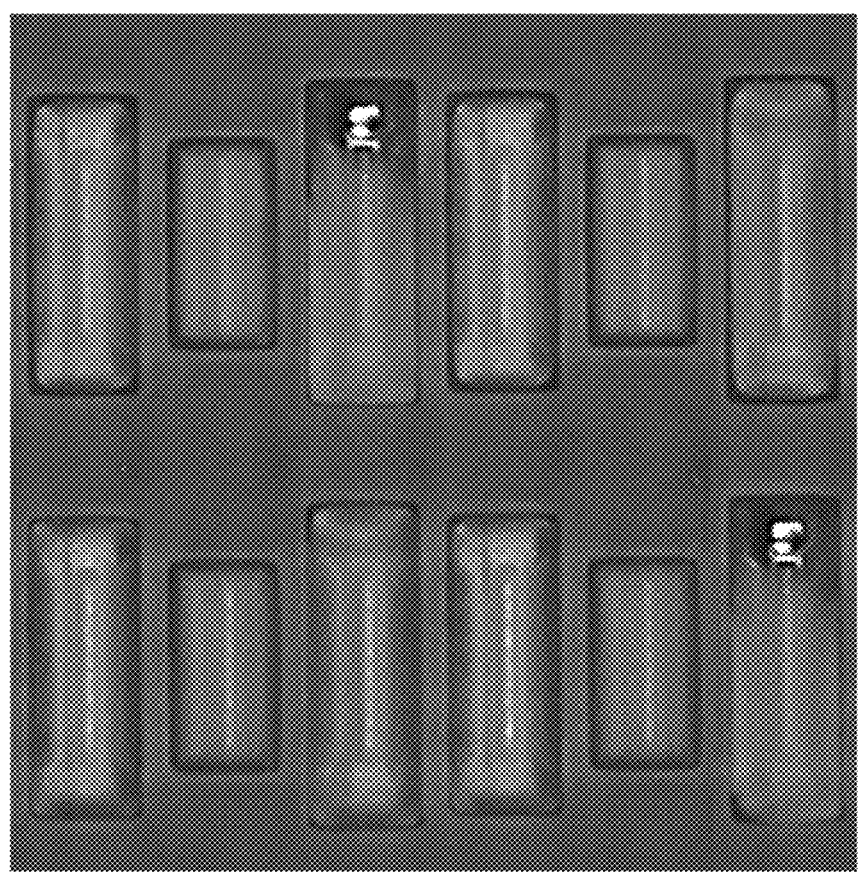
FIG. 14 illustrates an image in which an exposed contact hole is not filled with an inkjet material.

Referring to FIG. 14, an image in which the inkjet material is not filled in the exposed contact hole CH is illustrated. In FIG. 14, a portion indicated in white light is a portion in which the inkjet material is not filled.

Figure 15:
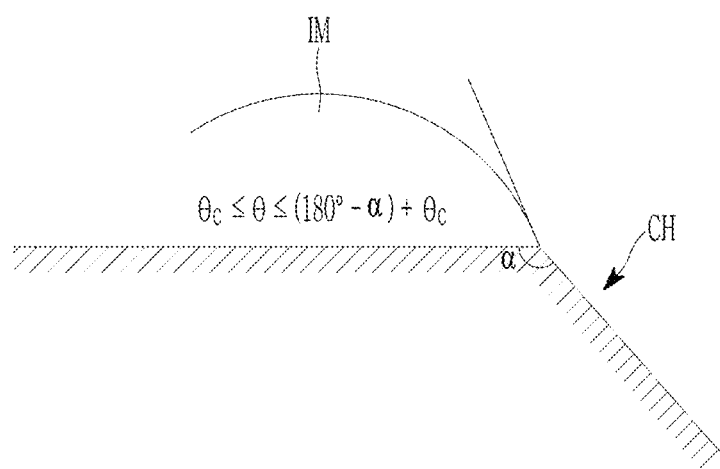
FIG. 15 illustrates a flow of an inkjet material near a contact hole.

FIG. 15 illustrates a flow of an inkjet material IM near a contact hole. As illustrated in FIG. 15, when the contact hole CH is defined to have an inclined surface, a flow of ink may stop near the contact hole CH. This is because, when the ink flows, a contact angle is desired to be equal to or greater than a taper angle (180°−α) of the contact hole CH of the ink so that the ink flows into the contact hole CH, and otherwise the ink does not flow into the contact hole CH.

Figure 16:
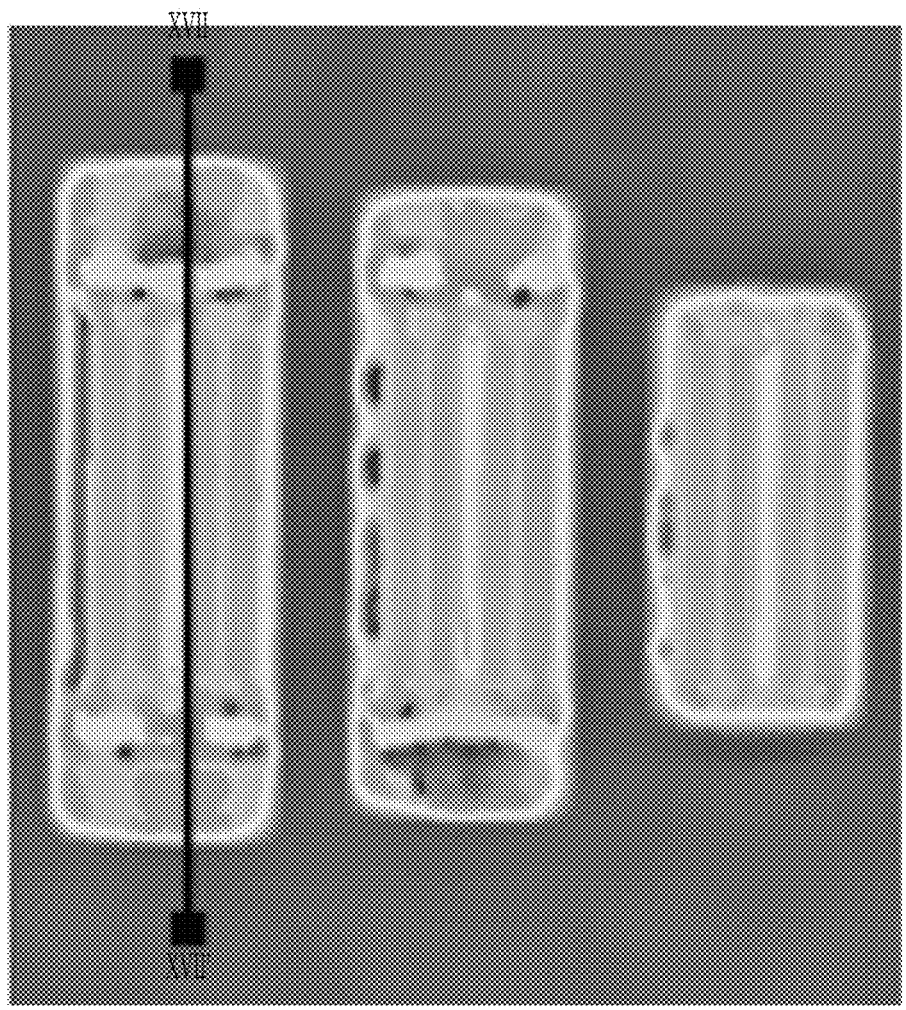
FIG. 16 illustrates an image showing a pixel filled with an inkjet material.
Figure 17:
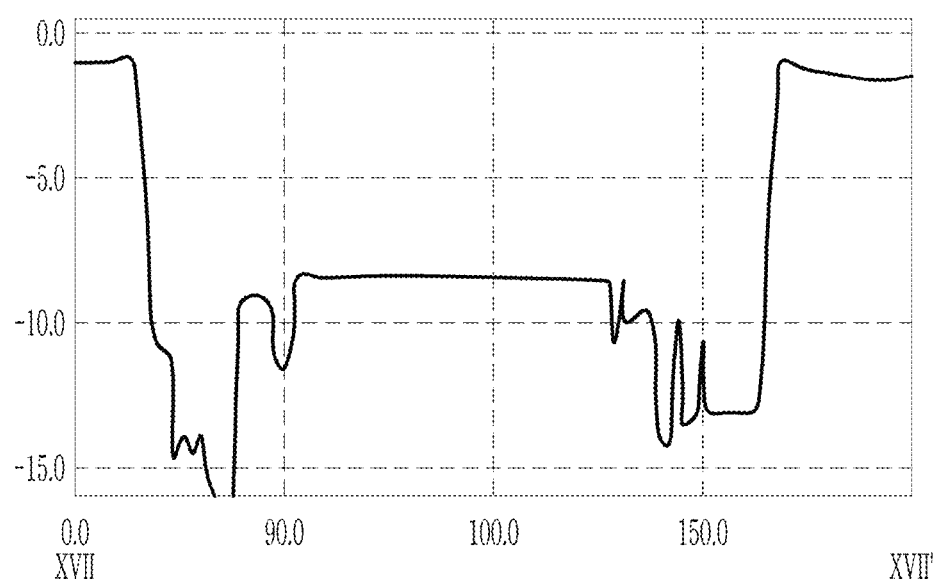
FIG. 17 illustrates a height measured along line XVII-XVII' of FIG. 16.

FIG. 16 illustrates an image showing a pixel filled with an inkjet material, and FIG. 17 illustrates a height measured after cutting along line XVII-XVII' of FIG. 16. Referring to FIG. 16 and FIG. 17, it was confirmed that a portion where the contact hole CH was defined was not filled with the inkjet material and thus had a low height.

That is, when the first partition wall PDL1 and the second partition wall PDL2 do not cover the contact hole CH, the inkjet material is not filled in a region where the contact hole CH is exposed. In this case, display quality may be deteriorated and a production yield of the display device may be reduced.

However, the display device in an embodiment of the invention solves this problem by forming the first partition wall PDL1 or the second partition wall PDL2 to cover all the contact holes CH.

Figure 18:
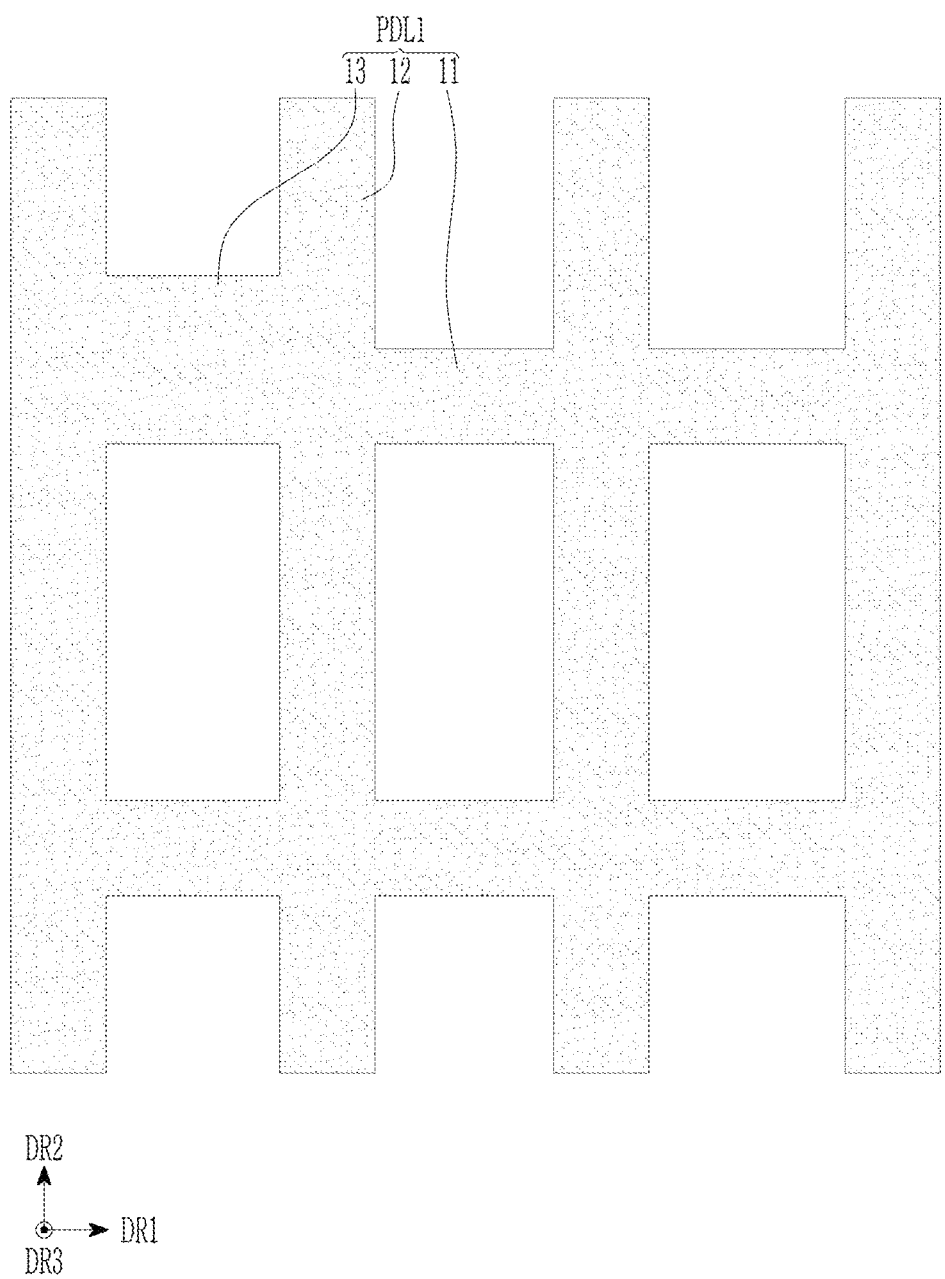
FIG. 18 illustrates an embodiment of a first partition wall of a display device.

FIG. 18 illustrates an embodiment of the first partition wall PDL1 of a display device. Referring to FIG. 18, the first partition wall PDL1 in the illustrated embodiment includes a horizontal portion 11 and a vertical portion 12. In this case, a portion of the horizontal portion 11 constitutes an extension 13 having a width greater than that of another portion of the horizontal portion 11 in the second direction DR2. The contact hole CH may be covered by the extension 13.

Figure 19:
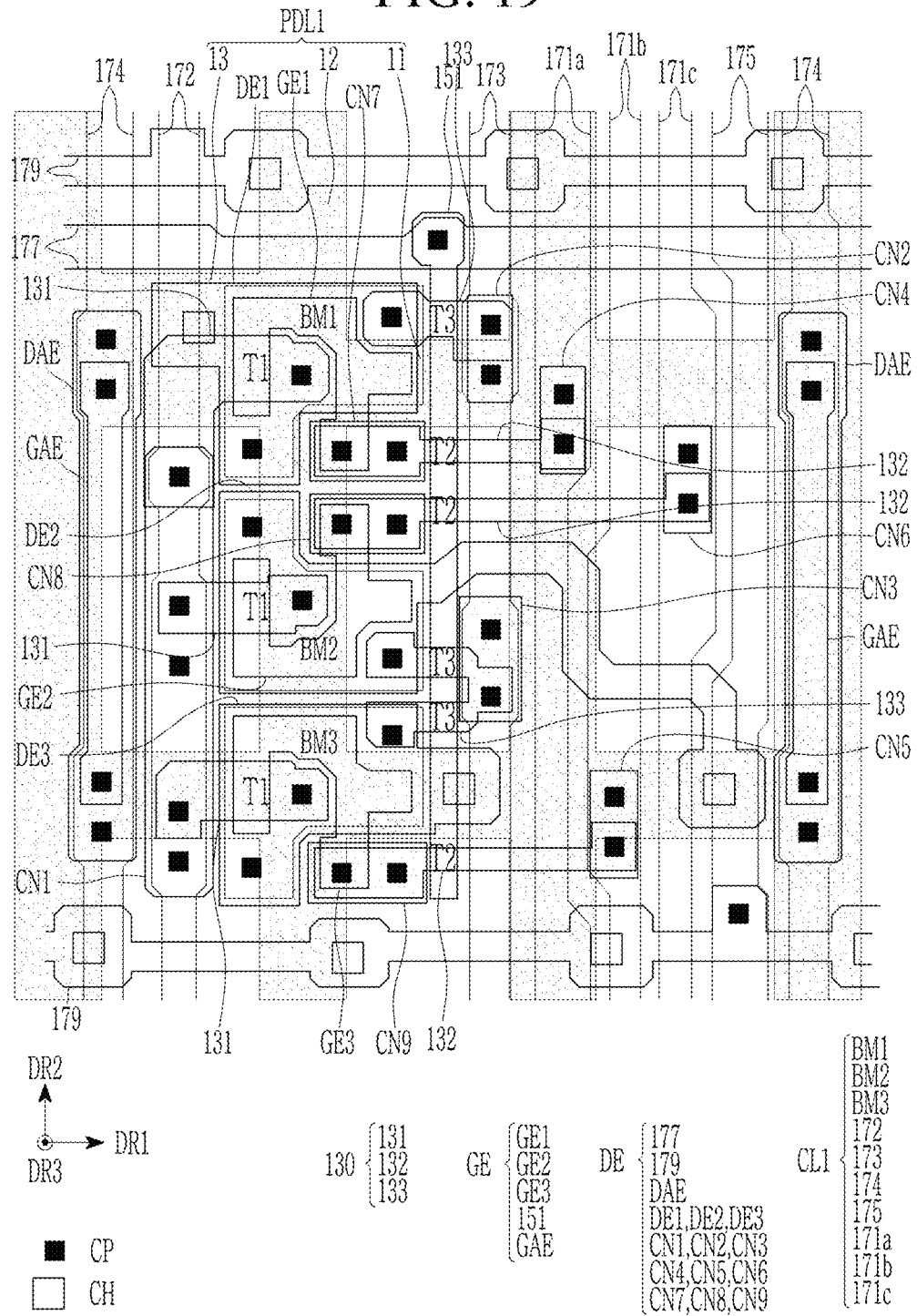
FIG. 19 illustrates an embodiment of a display device in which the first partition wall of FIG. 18 is formed.

FIG. 19 illustrates a display device in which the first partition wall PDL1 of FIG. 18 is formed. As illustrated in FIG. 19, the contact hole CH is covered by the first partition wall PDL1. Accordingly, a problem that an inkjet material was not sufficiently filled in the exposed contact hole CH was solved.

Figure 20:
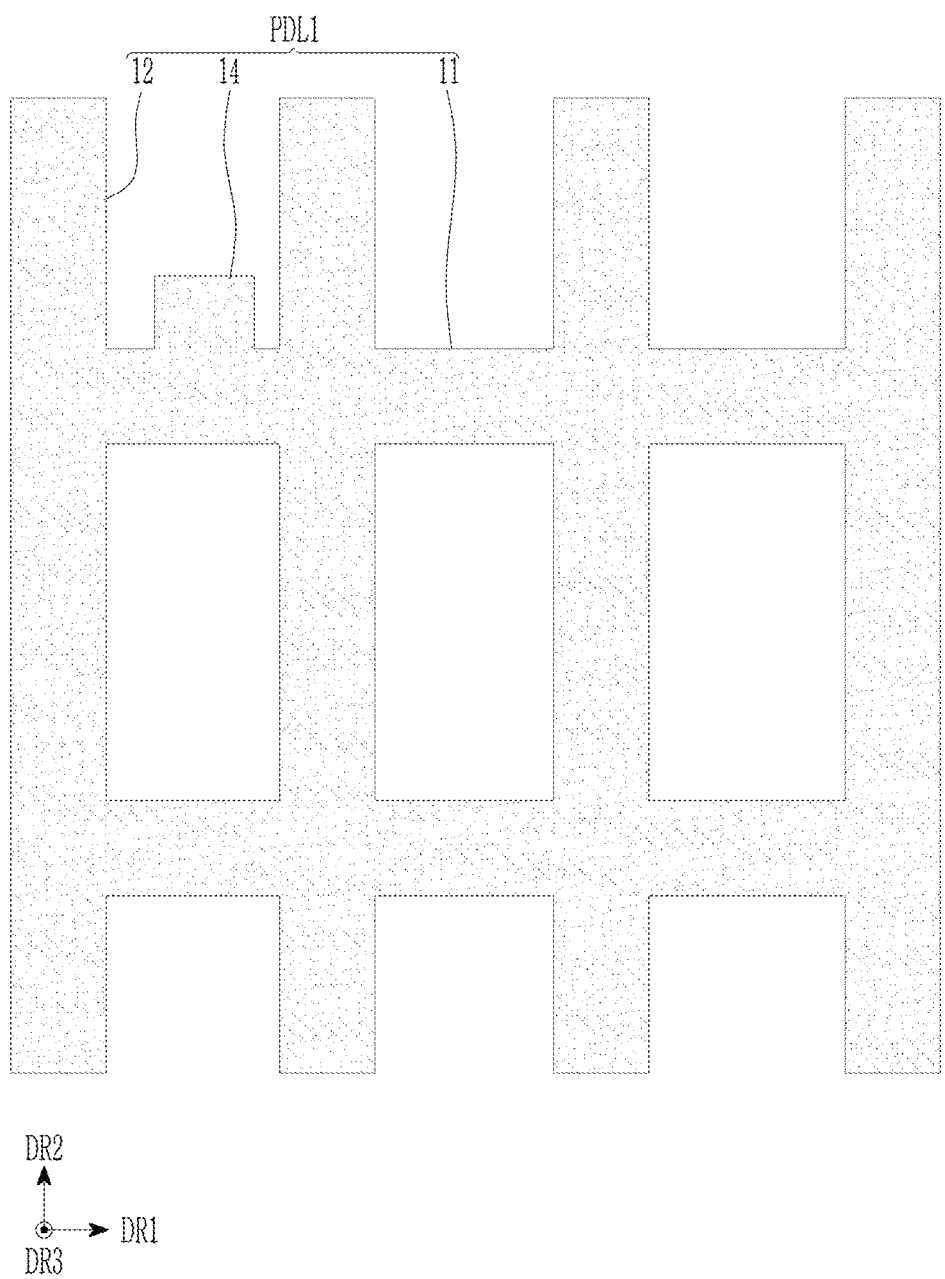
FIG. 20 illustrates an embodiment of a shape of a first partition wall.

FIG. 20 illustrates an embodiment of a shape of the first partition wall PDL1. Referring to FIG. 20, the first partition wall PDL1 in the illustrated embodiment includes a protrusion 14 in which a portion of the horizontal portion 11 protrudes in the second direction DR2. The contact hole CH may be covered by the protrusion 14.

Figure 21:
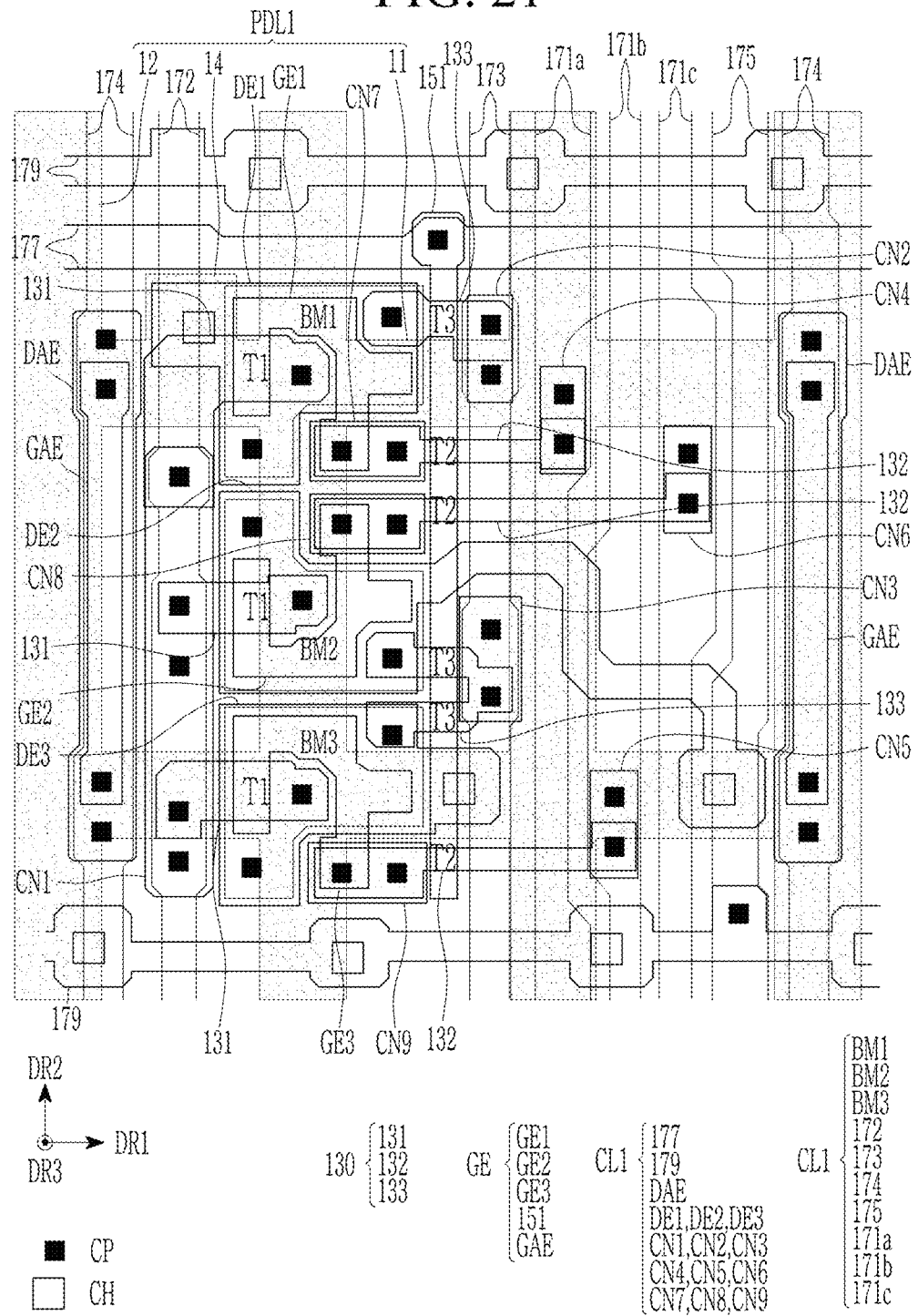
FIG. 21 illustrates a display device in which the first partition wall of FIG. 20 is formed.

FIG. 21 illustrates a display device in which the first partition wall PDL1 of FIG. 20 is formed. As illustrated in FIG. 21, the contact hole CH is covered by the protrusion 14 of the first partition wall PDL1. Accordingly, a problem that an inkjet material was not sufficiently filled in the exposed contact hole CH was solved.

Figure 22:
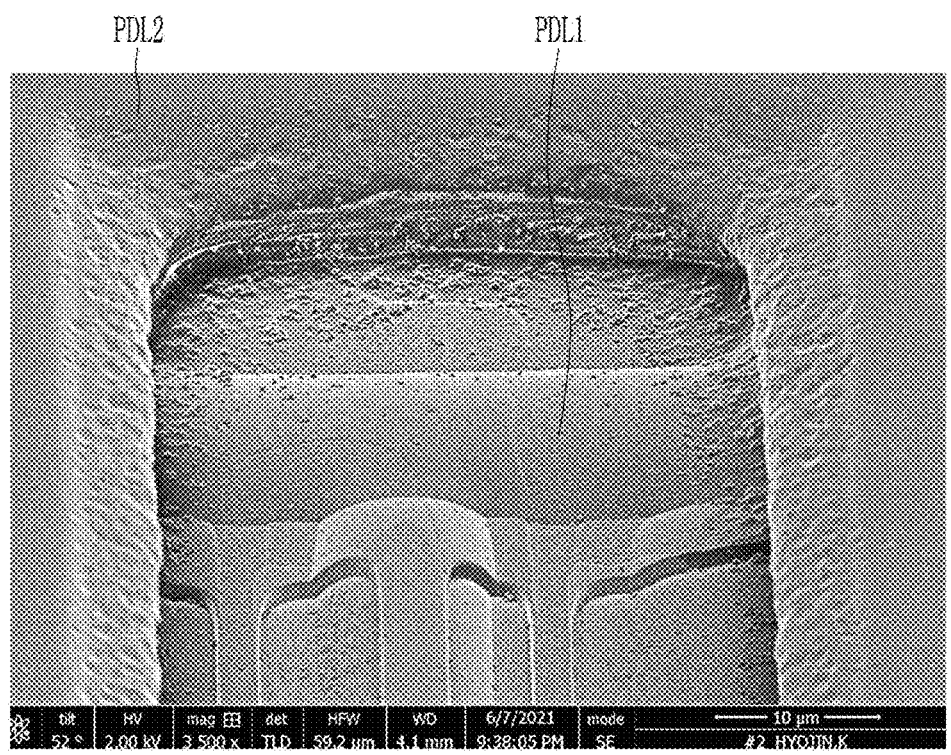
FIG. 22 illustrates an image of a pixel in which a contact hole is covered by a first partition wall.

FIG. 22 illustrates an image of a pixel in which the contact hole CH is covered by the first partition wall PDL1. Referring to FIG. 22, the contact hole CH is covered by the first partition wall PDL1 so that the step is not exposed. Referring to FIG. 12, it may be seen that the contact hole CH is covered in the illustrated embodiment.

Figure 23:
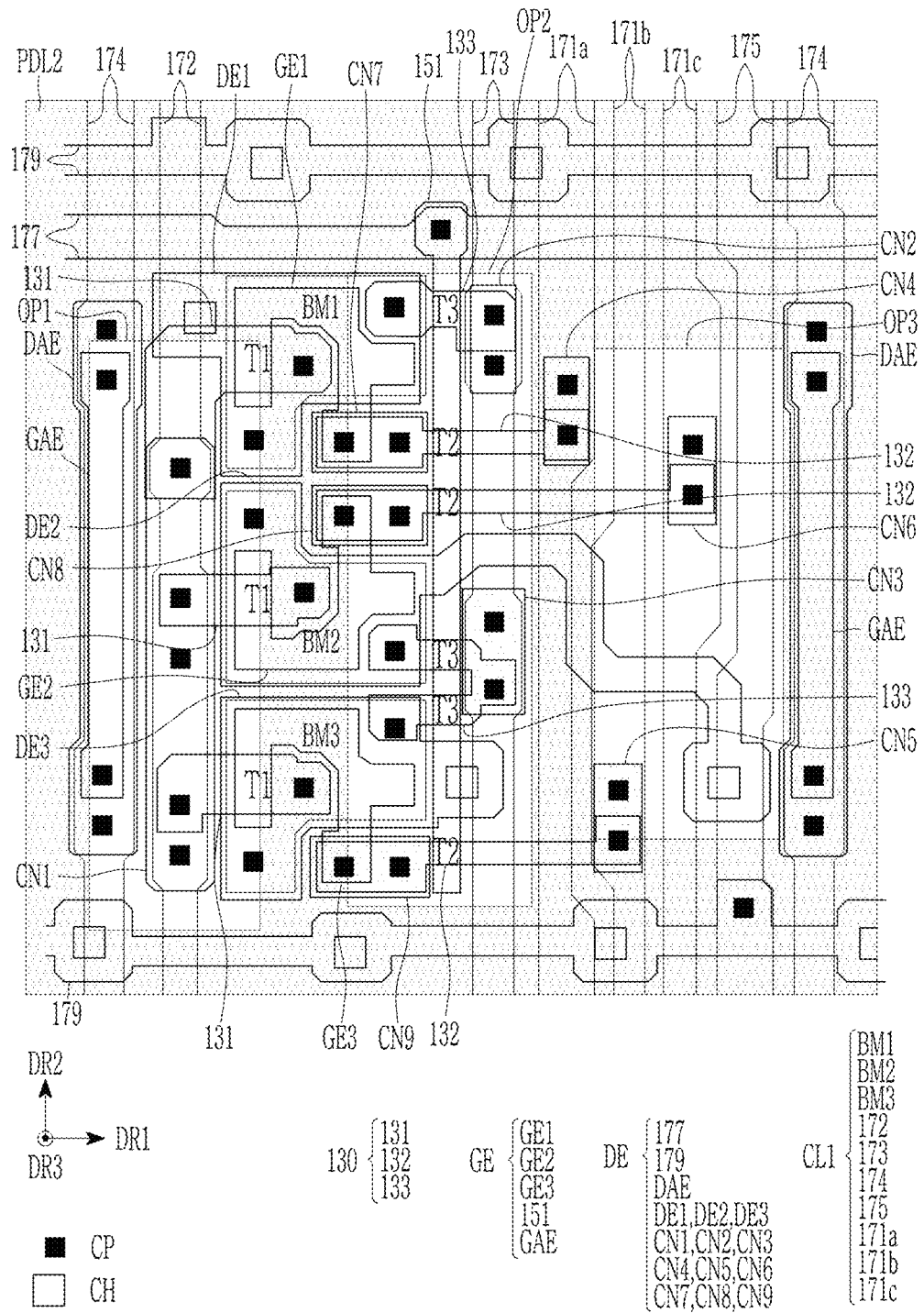
FIG. 23 illustrates an embodiment of a display device in which a second partition wall is disposed.

FIG. 23 illustrates an embodiment of a display device in which the second partition wall PDL2 is disposed. Referring to FIG. 23, the second partition wall PDL2 extends to cover the contact hole CH. Accordingly, a problem that an inkjet material was not sufficiently filled in the exposed contact hole CH was solved.

That is, in FIG. 23, an upper horizontal portion of the first opening OP1 of the second partition wall PDL2 is disposed below an upper horizontal portion of the second opening in the second direction DR2. Accordingly, the contact hole CH may be covered by the second partition wall PDL2.

Figure 24:
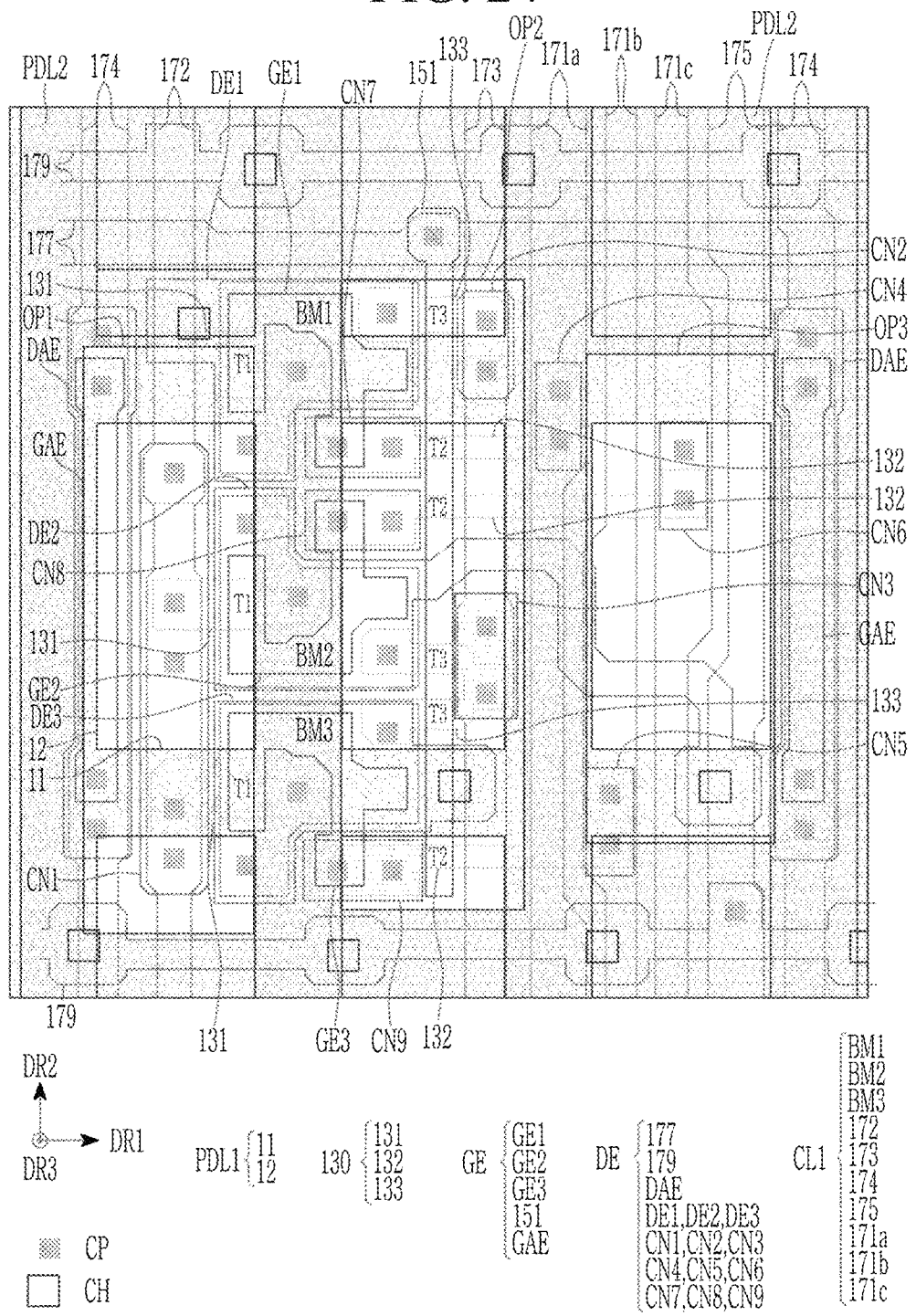
FIG. 24 illustrates a display device in which both a first partition wall and a second partition wall are disposed.

FIG. 23 illustrates a configuration in which only the second partition wall PDL2 is disposed, and FIG. 24 illustrates an embodiment in which both the first partition wall PDL1 and the second partition wall PDL2 are disposed. Referring to FIG. 24, the first partition wall PDL1 does not cover the contact hole CH, but a pixel contact hole is covered by the second partition wall PDL2.

Figure 25:
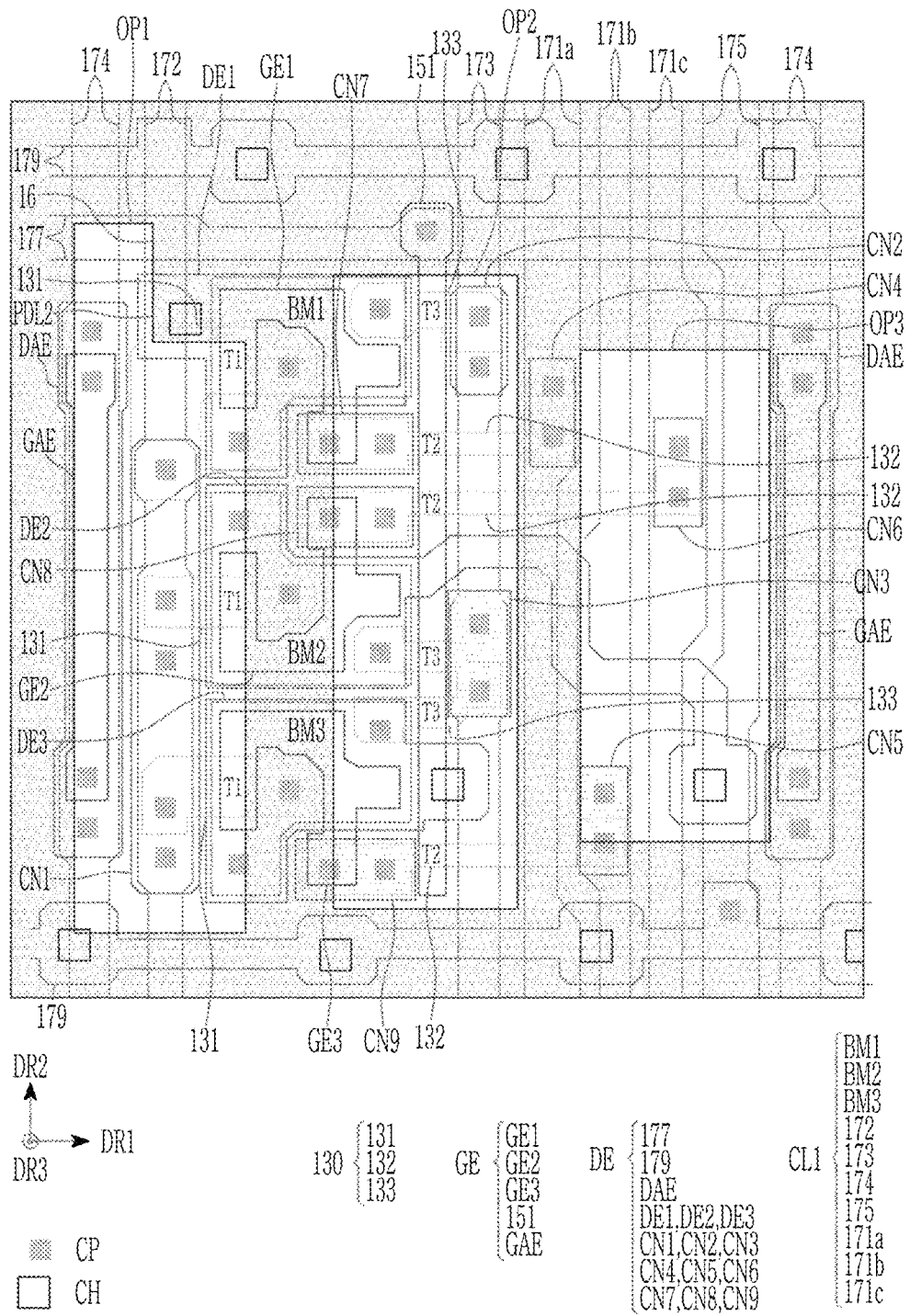
FIG. 25 illustrates an embodiment of a display device in which a second partition wall is disposed.

FIG. 25 illustrates an embodiment of a display device in which the second partition wall PDL2 is disposed. Referring to FIG. 25, a portion of the second partition wall PDL2 includes the protrusion 16 protruding in a direction of the first opening OP1. This protrusion 16 overlaps the contact hole CH and covers the contact hole CH. Accordingly, a problem that an inkjet material was not sufficiently filled in the exposed contact hole CH was solved.

Figure 26:
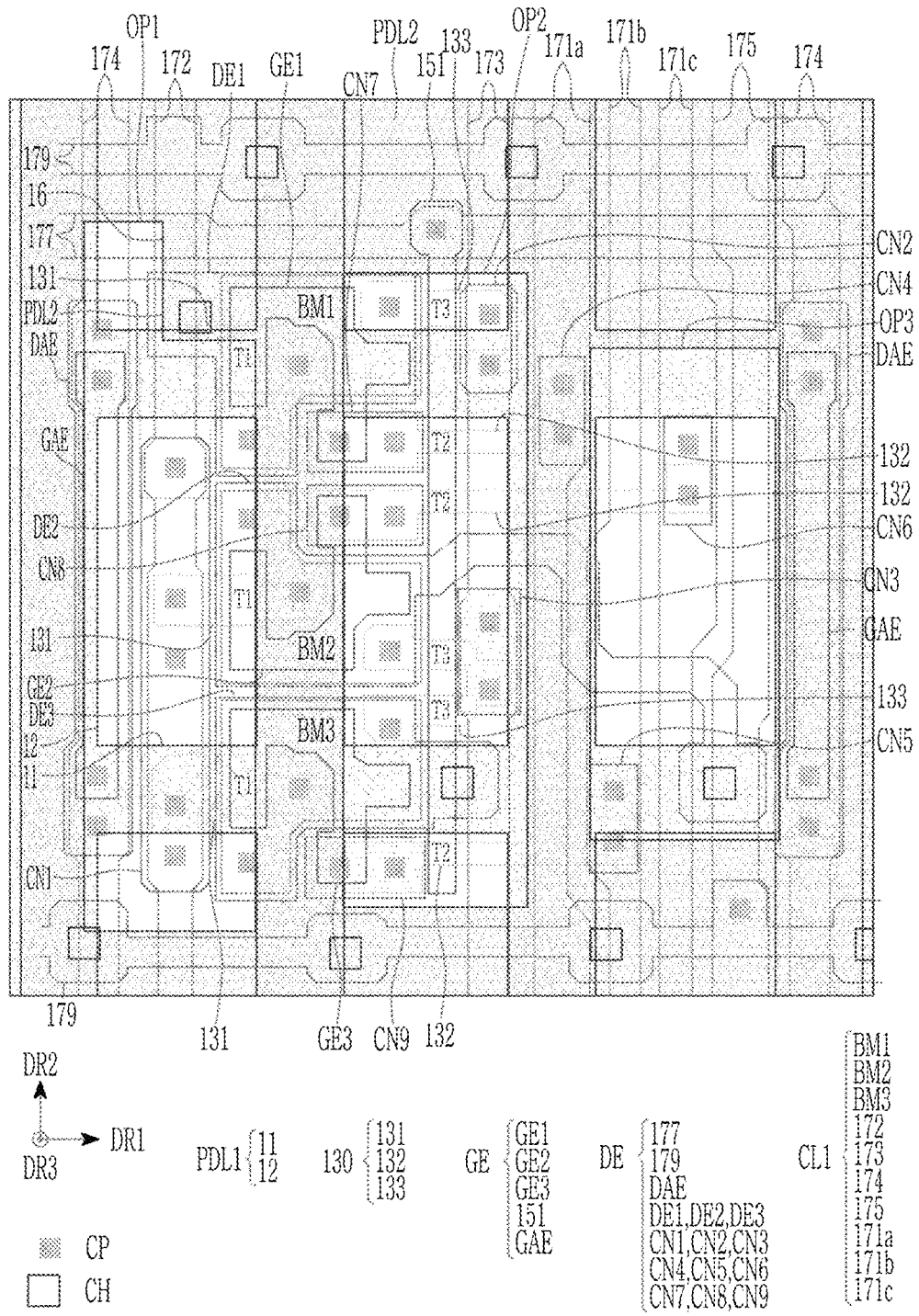
FIG. 26 illustrates a display device in which both a first partition wall and a second partition wall are disposed.

FIG. 25 illustrates a configuration in which only the second partition wall PDL2 is disposed, and FIG. 26 illustrates an embodiment in which both the first partition wall PDL1 and the second partition wall PDL2 are disposed. Referring to FIG. 26, the first partition wall PDL1 does not cover the contact hole CH, but a pixel contact hole is covered by the second partition wall PDL2.

That is, in the display device in the illustrated embodiment, the contact hole CH through which the transistor and the light-emitting device are connected is covered by the first partition wall PDL1 or the second partition wall PDL2. Accordingly, it is possible to solve the problem that the contact hole CH is not filled with an inkjet material due to a step difference of the exposed contact hole CH, and improve display quality and process yield.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a plurality of transistors disposed on the substrate;
   a light-emitting device connected to the plurality of transistors;
   a first partition wall disposed above the light-emitting device to partition an emission area; and
   a second partition wall overlapping the first partition wall,
   wherein a transistor of the plurality of transistors and the light-emitting device are connected to each other through a contact hole, and
   an entirety of an area of the contact hole overlaps the first partition wall,
   the first partition wall includes a vertical portion and a horizontal portion crossing each other, and
   a width of the horizontal portion overlapping the contact hole is greater than a width of the horizontal portion not overlapping the contact hole.

2. A display device comprising:
   a substrate;
   a plurality of transistors disposed on the substrate;
   a light-emitting device connected to the plurality of transistors;
   a first partition wall disposed above the light-emitting device to partition an emission area; and
   a second partition wall overlapping the first partition wall,
   wherein a transistor of the plurality of transistors and the light-emitting device are connected to each other through a contact hole, and
   an entirety of an area of the contact hole overlaps the first partition wall, wherein
   the first partition wall includes a vertical portion, a horizontal portion, and a protrusion protruding from the horizontal portion, and crossing each other, and
   the contact hole overlaps the protrusion.

3. The display device of claim 1, wherein
   a first opening, a second opening, and a third opening overlapping each emission area are defined in the second partition.

4. The display device of claim 3, wherein
   a size of the first opening is greater than that of the second opening, and
   the size of the second opening is greater than that of the third opening.

5. The display device of claim 4, further comprising
   a quantum dot layer disposed within each of the first opening, the second opening, and the third opening.

6. The display device of claim 1, wherein
the second partition wall does not overlap the contact hole.
7. The display device of claim 1, wherein
the second partition wall overlaps the contact hole.
8. The display device of claim 1, wherein
the plurality of transistors includes a first transistor, a second transistor, and a third transistor,
the first transistor receives a driving voltage,
the second transistor receives a data voltage, and
the third transistor receives an initialization voltage.
9. The display device of claim 8, wherein
a gate electrode of the first transistor is connected to one electrode of the third transistor.
10. A display device comprising:
a substrate;
a plurality of transistors disposed on the substrate, the plurality of transistors including:
  a first transistor;
  a second transistor; and
  a third transistor;
a light-emitting device connected to the plurality of transistors;
a first partition wall disposed above the light-emitting device to partition each emission area; and
a second partition wall disposed on the first partition wall,
wherein a transistor of the plurality of transistors and the light-emitting device are connected to each other through a contact hole, and
an entirety of an area of the contact hole overlaps the second partition wall,
the first transistor receives a driving voltage,
the second transistor receives a data voltage, and
the third transistor receives an initialization voltage.

11. The display device of claim 10, wherein
a first opening, a second opening, and a third opening overlapping each emission area are defined in the second partition wall.
12. The display device of claim 11, wherein
an upper horizontal portion of the first opening is disposed below an upper horizontal portion of the second opening in a predetermined direction.
13. The display device of claim 12, wherein
the third opening does not overlap the contact hole.
14. The display device of claim 11, wherein
the second partition wall includes a protrusion protruding to the first opening, and
the protrusion overlaps the contact hole.
15. The display device of claim 11, further comprising
a quantum dot layer disposed within each of the first opening, the second opening, and the third opening.
16. The display device of claim 10, wherein
the first partition wall includes a vertical portion and a horizontal portion crossing each other.
17. The display device of claim 16, wherein
the contact hole overlaps the first partition wall, and
a width of the horizontal portion overlapping the contact hole is greater than a width of the horizontal portion not overlapping the contact hole.
18. The display device of claim 16, wherein
the first partition wall includes a vertical portion, a horizontal portion, and a protrusion protruding from the horizontal portion, and crossing each other, and
the contact hole overlaps the protrusion.

* * * * *